United States Patent [19]

Ho et al.

[11] Patent Number: 5,878,070
[45] Date of Patent: Mar. 2, 1999

[54] PHOTONIC WIRE MICROCAVITY LIGHT EMITTING DEVICES

[75] Inventors: Seng-Tiong Ho, Wheeling; Jian P. Zhang, Evanston, both of Ill.

[73] Assignee: Northwestern University, Evanston, Ill.

[21] Appl. No.: 653,584

[22] Filed: May 24, 1996

Related U.S. Application Data

[63] Continuation-in-part of Ser. No. 450,284, May 25, 1995.

[51] Int. Cl.$^6$ ........................................................ H01S 3/05
[52] U.S. Cl. .............................. 372/92; 372/108; 372/66; 372/67; 372/94; 385/32; 385/31
[58] Field of Search ..................................... 372/108, 104, 372/66.67, 92, 94; 385/31, 32, 43

[56] References Cited

U.S. PATENT DOCUMENTS

| | | | |
|---|---|---|---|
| 3,934,148 | 1/1976 | Collins | 250/458 |
| 5,216,727 | 6/1993 | Vakhshoori et al. | 385/14 |
| 5,265,177 | 11/1993 | Cho et al. | 385/43 |
| 5,343,490 | 8/1994 | McCall | 372/94 |
| 5,351,261 | 9/1994 | Lanzerotti et al. | 372/98 |
| 5,526,449 | 6/1996 | Meade et al. | 385/14 |

OTHER PUBLICATIONS

Threshold Characteristics of Semiconductor Microdisk Lasers, Appl. Phys. Lett. 63 (10), Sep. 6, 1993, pp. 1310–1312, R. E. Slusher. et al.
Directional Light Coupling From Microdisk Lasers, Appl. Phys. Lett. 62 (6), Feb. 8, 1993, pp. 561–563, A. F. Levi, et al.
Whispering–Gallery Mode Microdisk Lasers, Appl. Phys. Lett. 60 (3), Jan. 20, 1992, pp. 289–291, S. L. McCall, et al.
Room–Temperature Lasing Action In $In_{0.51}Ga_{0.49}P/In_{0.2}Ga_{0.89}As$ Microcylinder Laser Diodes, Appl. Phys. Lett. 62 (17), Apr. 26, 1993, pp. 2021–2023, A. F. Levi, et al.
QELS 1991/Tuesday, May 14.
Spontaneous Emission From Excitions In Thin Dielectric Layers, Optics Letters, vol. 18, No. 11, Jun. 1, 1993, pp. 909–911, S. T. Ho, et al.
Estimation Of The Spontaneous Emission Factor For Microdisk Lasers Via The Approximation Of Whispering Gallery Modes, J. Appl. Phys. 75(7), Apr. 1, 1994, pp. 3302–3307, Chin, et al.
Spontaneous Emission From Excitons In Cylindrical Dielectric Wavguides And The Spontaneous–Emission Factor Of Microcavity Ring Lasers, Opt. Soc. Am. vol. 10, No. 2, Feb. 1993.
1.5 UM InGaAs/InAlGaAs Quantum–Well Microdisk Lasers, IEEE Photo. Tech, Ltr. vol. 5, No. 12, Dec. 1993, pp. 1353–1355, D. Y. Chu, et al.
Photonic–Wire Laser, Phy. Rev. Let., vol. 75, No. 14, Oct. 2, 1995, pp. 2678–2681, J. P. Zhang, et al.
Double–Disk Structure For Output Coupling In Microdisk Lasers, Appl. Phys, Lett. 65 (25), Dec. 19, 1994, pp. 3167–3169, D. Y. Chu, et al.

*Primary Examiner*—Rodney B. Bovernick
*Assistant Examiner*—Yisun Song
*Attorney, Agent, or Firm*—McAndrews, Held & Malloy, Ltd.

[57] ABSTRACT

A photonic light emitting device comprising a relatively high refractive index photonic-wire semiconductor waveguide core in the form of an arcuate shape, linear shape and combinations thereof. The waveguide core is formed into a closed loop cavity for a light-emitting device or laser. The waveguide core is surrounded on all transverse sides by relatively low refractive index medium and comprises an active medium having major and minor sides and semiconductor guiding layers proximate the major sides. The active medium and the guiding layers are so dimensioned in a transverse direction relative to the path of light propagation through the core to provide dramatically increased spontaneous-emission coupling efficiency, leaading to low lasing threshold and high intrinsic modulation rates.

42 Claims, 11 Drawing Sheets

$x=0.84, y=0.33$

PHOTONIC WIRE MICROCAVITY LIGHT EMITTING DEVICES

This application is continuation-in-part of Ser. No. 08/450,284 filed May 25, 1995.

CONTRACTURAL ORIGIN OF THE INVENTION

This invention was made with Government support under Grant Number: ECS-9502475 awarded by the National Science Foundation and Grant Number: F30602-94-1-003 awarded by the Advanced Research Project Agency of the Department of Defense. The Government may have certain rights in the invention.

FIELD OF THE INVENTION

The present invention relates to a light emitting device or laser and, more particularly, to a photonic-wire microcavity light emitting device or laser having high stimulated emission and hence gain and capable of high conversion efficiency from pumping power to optical output. When operated as a laser, it can have a low lasing threshold. Other advantages include extremely high near-ideal photon emission efficiency into the electromagnetic field mode of interest, small physical size, and high intrinsic modulation rate when operated above the lasing threshold. In addition, it can be coupled directly to strongly-guided waveguides, making it suitable for application to very-high-density photonic integrated circuits.

BACKGROUND OF THE INVENTION

Microcavity semiconductor lasers recently have been described for operation. Such microcavity semiconductor lasers employ an active lasing medium that support optical modes in a short cavity. For example, a microdisk laser is described by McCall et al. in "Whispering-Gallery Mode Microdisk Lasers" in *Appl. Phys. Lett.* 60, (3), 20 Jan., 1992. Such microcavity laser supports the electromagnetic field mode in a thin disk on top of a small supporting pillar.

Microcavity semiconductor lasers are advantageous as compared to conventional semiconductor lasers in being much smaller in size and requiring substantially less minimum operating current (power) in the range of microwatts. Recently, in Directional Light Coupling From Microdisk Lasers, *Appl. Phys. Lett.* 62, 561 (1993) an asymmetric point was introduced into a microdisk to provide a location of increased quantity of lasing light to leak out from the point of asymmetry. Light emitted from such a thin disk with thickness d from the asymmetric point can undergo a large angle of diffraction in the directions perpendicular to the disk plane. According to the physical law of diffraction, the diffraction angle is given by Theta=2*ArcTan(lambda/d) in radians and will occur at a distance of $2\pi d^2$/lambda away from the edge of the disk. The thin disk of thickness around 0.2 micron emitting at a wavelength of 1.5 microns will give rise to a diffraction angle of Theta=2.88 radians or almost 165 degrees and will occur at 0.15 micron from the disk's edge. This means that the light emitted from the disk will disperse away rapidly within a short distance of less than two tenths of a micron, which makes it very difficult, if not impossible, to collect a useful fraction of the output laser light into a semiconductor waveguide in practice.

Microdisk lasers can have high efficiency (with a spontaneous-coupling factor of larger than 0.1) only in the limit of small disk radius of 1–1.5 microns for the emission wavelength of 1.5 microns. The required disk radius scales linearly with the optical wavelength. This makes it very difficult to realize an efficient microdisk laser at short wavelength range, such as the visible wavelength of 0.5 microns. Visible microcavity lasers are important as they have applications to color display or high-density optical storage or sensing. According to the above scaling rule, at the visible wavelength of 0.5 microns, an efficient microdisk will need a disk radius of 0.3–0.5 microns and will be difficult to fabricate and suspend on a pillar.

The difficulty of obtaining useful light from microdisk lasers and their small disk size needed for high cavity efficiency make it difficult to use microdisk lasers in many practical applications.

An object of the present invention is to provide a photonic-wire light emitting device or laser which has an extremely high spontaneous-emission coupling efficiency or factor of for example 0.3 and larger by virtue of use of a photonic-wire waveguide core combined with microcavity structure and which can be scaled to operate at the visible wavelength range without the aforementioned problem.

Another object of the present invention is to provide a photonic-wire microcavity light emitting device or laser amenable for coupling light out from the device to, for example, a semiconductor waveguide efficiently because of its extremely high spontaneous-emission coupling efficiency or factor. In addition, the photonic-wire laser can be modulated at a very high modulation rate, which will enable high data transmission in a photonic circuit.

Yet still another object of the present invention is to provide a photonic-wire microcavity light emitting device or laser amenable for coupling light out from the device to a strongly-guided semiconductor waveguide, making it amenable for coupling to very-high density integrated optical circuits connected by such waveguides. Such strongly-guided waveguides can make bends of smaller than 1 micron radius with negligible photon loss, making it possible to integrate 1000 or more optical components within a 1 millimeter square area and resulting in very-high density photonic integrated circuits. Furthermore, the photonic-wire device can be integrated via direct fabrication on a wafer instead of via hybrid integration. Such very-high density photonic integrated circuits will have applications to optical communications, optical interconnects, optical sensing, optical signal processing, and optical computing.

In comparison, conventional integrated optical circuits are typically made up of hybrid optical components consisting of semiconductor lasers with long cavity lengths of 300 microns (0.3 millimeters). The laser components are coupled to weakly-guided ridge waveguides. A weakly-guided waveguide cannot make a bend with a radius smaller than a few millimeters without incurring very high photon loss because of radiation from the bend. This seriously restricts the integration density of the current typical integrated optical circuits to at most a few components in a millimeter square area.

Yet still an additional object of the present invention is to provide a highly efficient cavity for applications to visible semiconductor laser light sources or light-emitting diodes (LEDs) with edge emission, which are difficult to realize at present due partially to the low efficiency of conventional cavity designs.

SUMMARY OF THE INVENTION

The present provides a photonic-wire light emitting device or laser comprising a relatively high refractive index photonic-wire waveguide core which is surrounded in all directions transverse to photon propagation direction, such as, for example, both in a width direction and thickness direction, of the waveguide core by relatively low refractive index medium, such as air, silica or other relatively low refractive index material, to spatially confine photons strongly in all directions perpendicular to their propagation direction in the waveguide core. The waveguide core comprises an optically active excitable medium (hereafter referred to as active medium), which can give rise to radiation or absorption of electromagnetic field energy, and in particular gain or luminescence. The active medium is bordered on the major sides by guiding semiconductor layers. The active medium typically comprises layers of semiconductor quantum wells or excitable rare earth ions. The active medium and guiding layers are so dimensioned in transverse directions relative to the path of light propagation through the waveguide core as to provide greatly increased spontaneous-emission coupling efficiency for photons emitted by the quantum wells into a particular electromagetic field mode of interest.

The present invention provides in an embodiment a light emitting device having Beta(tot) much larger than that available from conventional semiconductor laser cavity design and from which a working device can be realized. For example, a typical prior semiconductor laser cavity with a 300 micron long linear cavity defined by a ridge waveguide exhibits a Beta(tot) value of about 0.00001 for a Beta(space) =0.004 and Beta(Freq)=0.003. The present invention provides a light emitting device having a Beta(tot) which can be as large as 0.3 and higher achieved through combined use of photonic-wire waveguides, microcavity structure, and an appropriate active medium, such as quantum wells.

A particular photonic-wire light emitting device in accordance with an embodiment of the present invention comprises a relatively high refractive index photonic-wire semiconductor waveguide core. The photonic-wire waveguide core is formed into an arcuate shape, linear shape and combinations thereof. As described in more detail below, when the photonic-wire waveguide is closed onto itself, forming a closed loop cavity, a high Q and high gain cavity is provided. The high Q cavity can be an efficient cavity for the light-emitting device or laser and, in particular, can be a lasing microcavity.

The high refractive index semiconductor waveguide core is surrounded by a relatively low refractive index medium on all sides. This confines photons tightly in directions perpendicular to their direction of propagation. The strong confinement forms strong confining potential walls for photons, and the waveguide is called a photonic-wire waveguide. The strong potential is necessary to affect the emission properties of the active medium of the waveguide, and can be used to dramatically increase the percentage of emission into one particular waveguiding mode of interest. For example, typical semiconductor waveguide core materials for use in practicing the invention have a refractive index $n_{core}$ greater than about 2.5, such as from about 3 to about 3.5 and above for InGaAsP, AlGaAs, etc. materials, whereas typical low-refractive index mediums for use in practicing the invention have refractive index $n_{low}$ below about 2.0, such as from about 1.6 to about 1.0 for silica, silicon nitride, acrylic, polyimide, aluminum oxide, epoxy, photoresist, PMMA, spin-on glass, polymers with low absorption at the emission wavelength, or air. The ratio of the refractive indices $n_{core}/n_{low}$ has to be larger than about 1.3 to obtain substantial advantages of the invention.

The waveguide core comprises an active medium having major and minor sides and semiconductor guiding layers proximate the major sides to define a generally rectangular core cross-section comprising a width dimension and thickness dimension. The width dimension or direction is parallel to the substrate on which the waveguide is disposed, while the thickness dimension or direction is perpendicular to the substrate.

The strong photon confinement is provided in the width direction and the thickness direction in one embodiment. Low refractive index materials described above are the materials residing on all sides of the waveguide core along the width direction and thickness direction.

Optical coupling of the device described hereabove to an output can be effected by an output-coupled waveguide proximate a portion of the periphery of the waveguide core in a manner to achieve resonant photon tunneling. A typical design can consist of a cavity coupled to a U-shaped output-coupled waveguide encircling part of the cavity with a small low-refractive-index gap between the outputcoupled waveguide and the photonic-wire waveguide of the cavity. In order to achieve resonant photon tunneling of photons, the mode width for the electromagnetic field mode propagating in the output-coupled waveguide must be close to the mode width for the electromagnetic field mode propagating in the cavity. This will ensure that the field modes propagating in the output-coupled waveguide and the cavity have similar propagating velocities so that they can couple to each other with maximal efficiency.

The vertical layer structure of the output-coupled waveguide can be the same as that of the photonic-wire waveguide that forms the cavity. In that case, the output waveguide is excited by optical or electrical pumping to avoid absorption of light by the unexcited active layer(s) in the waveguide. To avoid the need for pumping the output-coupled waveguide, its vertical structure may be the same as that of the cavity's photonic-wire waveguide but without the active medium. The output-coupled waveguide can be formed at a level on a substrate compatible with an integrated optical circuit present on the substrate so as to provide light output signals to the optical circuit.

A typical single light emitting device (as opposed to integrated circuit device) useful for practical applications can be provided via cleaving the ends of the U-shaped waveguide. The cleaved ends will provide radiation of the light in the output-coupled waveguide into free space (i.e. air). The spatial mode profile of this free-space radiation can be manipulated as described below.

The above objects and advantages of the present invention will become more readily apparent from the following detailed description taken with the following drawings.

DESCRIPTION OF THE DRAWINGS

FIG. 2, 2-1 and 2A are a partial cross-sectional view through the cavity formed with an annular-shaped waveguide of the light emitting device of the invention.

In FIG. 7A, $d_1$ is mode width of mode 0, $d_2$ is mode width of mode 1, $d_s$ is waveguide width wherein $d_s = R_{1out} - R_{1in}$ and $d_s$ is greater than $d_1$ and about equal to $d_2$.

DETAILED DESCRIPTION OF THE INVENTION

Figure 1:
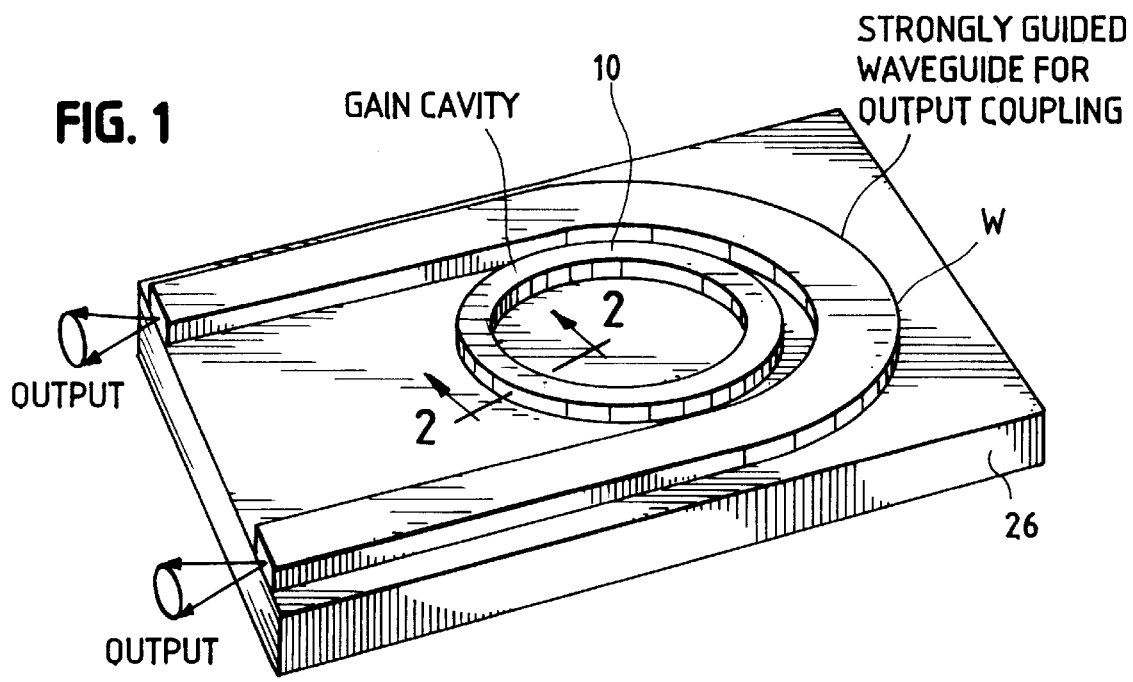
FIG. 1 is a perspective view of a ring-shaped photonic-wire light emitting device in accordance with one embodiment of the invention with an arcuate output-coupled waveguide encircling a portion of the periphery of the photonic-wire waveguide.
Figure 2:
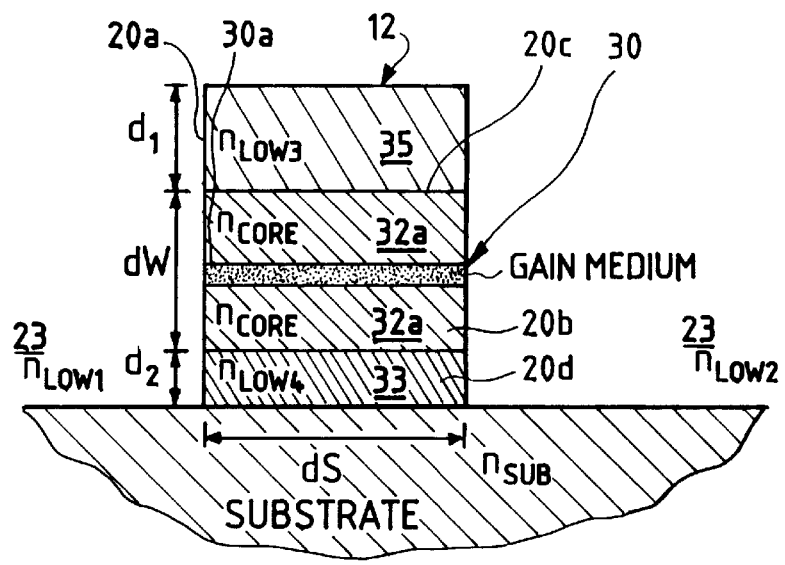
Figures 1, 2:

Referring to FIGS. 1 and 2, a photonic-wire light emitting device 10 in accordance with one embodiment of the invention is illustrated schematically as including a relatively high refractive index photonic-wire waveguide core 20 which is surrounded by a relatively low refractive index medium 23 in a width direction of the core 20 and a relatively low refractive medium 33, 35 in a thickness direction of the core 20. In particular, the high refractive index semiconductor waveguide core 20 is surrounded on lateral sides 20a, 20b by relatively low refractive index medium 23 on two sides 20a, 20b defining the width dimension ds of the waveguide core by the relatively low refractive index medium. The waveguide core 20 also is surrounded on the top and bottom sides 20c, 20d by relatively low refractive index medium 33, 35 on top and bottom sides defining the thickness dimension dw of the waveguide core 20 by the relatively low refractive index medium 33, 35. The surrounding of the waveguide core 20 in both of these dimensions or directions is effective such that photons are tightly confined in all directions perpendicular to their direction of propagation. The strong confinement forms strong confining potential walls for photons and restricts photons to move relatively freely only in one direction, and the waveguide is called a photonic-wire waveguide. The strong potential is necessary to affect the emission properties of the optically active, excitable medium of the waveguide, and can be used to dramatically increase the percentage of emission into one particular waveguiding mode of interest.

For example, typical semiconductor waveguide core materials for use in practicing the invention have a refractive index $n_{core}$ greater than about 2.5, such as from about 3 to about 3.5 and above for InGaAsP, AlGaAs or InGaN materials, whereas typical low refractive index mediums described below for use in practicing the invention have refractive index $n_{low}$ below about 2.0, preferably below 1.6, such as from about 1.5 to about 1.0. The ratio of the refractive indices $n_{core}/n_{low}$ is larger than about 1.3 to obtain substantial advantages of the invention, and preferably larger than 2.0.

For purposes of illustration and not limitation, in FIGS. 1 and 2, the waveguide core 20 is disposed on top of the substrate 26, which may comprise InP (indium phosphide) or other suitable substrate material, such as GaAs (gallium arsenide). The relatively low refractive index medium 23 includes air (refractive index of 1) that borders the left and right sides 20a, 20b of the waveguide core 20 in FIG. 1. The relatively low refractive index medium 23, 33, 35 includes air (refractive index of 1.0) in FIG. 1. The low refractive index mediums 23, 33, 35 serve to spatially confine photons tightly in the width and thickness directions perpendicular to photon circumferential propagation direction in the waveguide core. Other low refractive index mediums that may be used include acrylic, epoxy, silicon dioxide ($SiO_2$), aluminum oxide, silicon nitride, spin-on glass, polymers with low absorption at the emission wavelength, photoresist, poly-methyl metacrorate, and polyimide. The same or different low refractive index mediums 23, 33, 35 can be used on the sides 20a, 20b, 20c, and 20d.

Figure 2A:
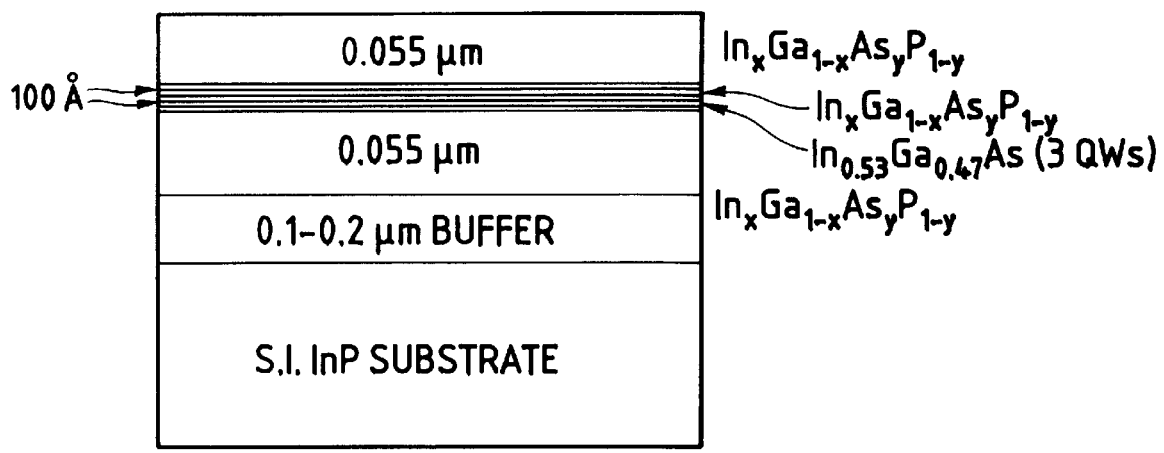

The relatively high refractive index photonic-wire waveguide core 20 comprises an optically active excitable medium (hereafter active medium) 30 which can give rise to radiation or absorption of electromagnetic field energy and, in particular, gain or luminescence, when pumped or excited optically or electrically. The active medium 30 typically comprises layers 31 of semiconductor quantum well, quantum wire, or quantum dot (layers shown in FIG. 2-1) having major sides 31A parallel to one another and minor sides that are defined by the thickness of each layer. In order to more effectively radiate into the guided mode, the active medium is located generally around the midpoint of the core thickness dimension dw and each may comprise $In_{0.53}Ga_{0.47}As$ or other suitable active quantum well, quantum wire, or quantum dot material (see FIG. 2A).

Disposed proximate the major sides of the active medium are major sides of guiding semiconductor layers such as layers 32a, 32b which also have minor sides defined by the thickness of the layers involved. As shown in FIG. 2, barrier layers 31B (two shown) are disposed between the quantum well layers 31. The guiding or barrier layers each may comprise $In_{0.84}Ga_{0.16}As_{0.67}P_{0.33}$ or other suitable passive guiding or barrier materials (see FIG. 2A). The refractive index of the guiding layers 32a, 32b and active medium 30 is at least 1.3 times as great as that of relatively low refractive index mediums 23, 33, 35 bordering the sides 20a, 20b, 20c, 20d of the waveguide core.

The active medium 30 alternately may comprise one or more optically active rare earth ion containing layers in lieu of the quantum well layers 31. The rare earth ion containing layers are located generally at the midpoint of the core thickness dimension dw and each can comprise rare earth ion doped semiconductor material (e.g. $Er^{+3}$ doped InP) or other suitable optically active rare earth ion containing material. When the rare earth ion containing layers are employed, the guiding layers comprise the same material described above.

In practicing embodiments of the invention, the photonic-wire waveguide can comprise semiconductor materials $In_xGa_{1-x}As_yP_{1-y}$ or $In_xAl_{1-x-y}Ga_yAs$ as the $n_{core}$ material and an aforementioned material with a refractive index of about 1.6 or lower as the $n_{low}$ material. Alternately, the photonic-wire waveguide can comprise semiconductor materials $In_xGa_{1-x}N$ or $Al_xGa_{1-x}N$ as the $n_{core}$ and $n_{high}$ materials and a material with a refractive index of about 1.6 or lower as the $n_{low}$ material. Still further, the photonic-well waveguide can comprise semiconductor materials $Al_xG_{1-x}As$ or $In_xGa_{1-x}P$ as the $n_{core}$ and $n_{high}$ materials and a material with a refractive index of about 1.6 or lower as the $n_{low}$ material.

The active medium 30 can be excited by suitable means such as optically (e.g. by a pumping laser providing pulsed light of appropriate duty cycle) or electrically (e.g. by electrical current pulses of appropriate duty cycle comprising injection current pumping through a p-n diode junction) as is known. Injection current is supplied to core 20 via conventional transparent conductor (not shown) such as indium tin oxide at suitable location in the waveguide structure.

The layers 31, 32 define in FIG. 1 a circular shape waveguide core 20 having an inner diametral rim or surface and outer diametral rim or surface. When the circular shape is closed onto itself as such, forming a closed loop, a high Q and high gain cavity is provided. Let the length of this cavity be Lc, defined approximately by the averaged physical length of the outer and inner perimeters of the closed loop. The normalized cavity length is then defined by Lc=Lc/(lambda/$n_c$), where lambda is the emission wavelength of the active layers and $n_c$ is the effective refractive index for the electromagnetic field mode propagating in the waveguide core 20 ($n_c$ typically is well approximated by the refractive index of the waveguide core material $n_{core}$ but may fall to below $n_{core}$, such as about 0.7 $n_{core}$ when the normalized thickness is thin, such as about 0.4). The normalized length of the cavity is typically smaller than 1000. The high Q (Q being quality value of the cavity at transparency or in the absence of material absorption) cavity can be an efficient laser cavity and in particular, can be a lasing microcavity. The invention is not limited to circular shaped waveguide cores and can be practiced with linear shaped waveguide cores and waveguide cores having arcuate segments and linear segments.

For efficient operation of the light emitting device or laser, it is desireable to capture as much emission power into the electromagnetic field mode of interest (usually a guided TE mode or TM mode of the waveguide) both spatially and spectrally. The spatial mode is usually defined by the spatial profile of the guided mode. The spectral modes are clearly defined in a cavity situation for which there are discrete cavity resonance frequency modes. The spectral modes are then the cavity resonance frequency modes.

The percentage of emission captured spatially into the electromagnetic field mode of interest will be denoted by Beta(space). The emission from an optically active medium usually spans a certain frequency range given by an effective spectral width, dfe. For those emission that is captured spatially into the field mode of interest, there are many cavity resonance frequency modes it can emit into, the percentage of which captured into the resonance frequency mode of interest being denoted by Beta(Freq). Let the frequency spacing between two adjacent resonance frequency modes be given by dfc. For the case where the spectral width of the emission is larger than dfc (i.e. dfe greater than dfc), the value of Beta(Freq) is approximately given by Beta(Freq)=(dfc/dfe)*(2/π). For high Beta(Freq) value, it is generally desirable to have narrow emission spectral width, such as that typically provided by semiconductor quantum wells, quantum wires, quantum dots, or rare earth ions.

The total percentage of emission captured into the desired field mode both spatially and spectrally is the product of Beta(space) and Beta(Freq) and is denoted by Beta(tot). That is, Beta(tot)=Beta(space)*Beta (Freq). Beta(tot) is called the spontaneous emission coupling efficiency.

The value of dfc is related to the cavity length via a simple relation of dfc=c/($n_c$Lc), where c is the speed of light in vacuum ($10_8$ meters per second), Lc is the round trip physical length of the cavity, and $n_c$ is the effective propagation refractive index for the modes propagating in the cavity (or more accurately $n_c$Lc is the effective round trip optical path length of the cavity). An optical cavity can be said to be an ideal microcavity when the cavity size Lc is so small as to give a large dfc value so that Beta(Freq) approaches unity (i.e. when dfc is almost as large as dfe so that (BetaFreq)=1.0). In practice, an optical cavity can be said to be a microcavity if it's (BetaFreq) is larger than approximately 0.03 (10 times larger than that of the conventional semiconductor laser structure described). It can be said to be a good microcavity if Beta(Freq) is larger than 0.1.

The present invention provides in an embodiment a light emitting device having Beta(tot) much larger than that available from the usual semiconductor laser cavity design and from which a working device can be realized. For example, a typical prior semiconductor laser cavity design with a 300 micron long linear cavity defined by a ridge waveguide exhibiting a Beta(tot) value of about 0.00001 for a Beta(space)=0.004 and Beta(Freq)=0.003. The present invention provides a light emitting device having a Beta(tot) which can be as large as 0.3 and higher achieved through combined use of photonic-wire waveguides, microcavity structure and an appropriate active medium, such as quantum wells.

A particular photonic-wire light emitting device in accordance with an embodiment of the present invention comprises a relatively high refractive index photonic-wire semiconductor waveguide core 20. The photonic-wire waveguide core is formed into an arcuate shape, linear shape, and combinations thereof. As described in more detail below, when the photonic-wire waveguide 12 is closed onto itself forming a closed loop cavity, a high Q and high gain cavity is provided. The details of the cavity design are essential for achieving high Q value and will be described below. The high Q cavity can be an efficient cavity for the light-emitting device or laser and in particular, can be a lasing microcavity.

The high refractive index semiconductor waveguide core is surrounded by a relatively low refractive index medium on all sides 20a, 20b, 20c, and 20d. This confines photons tightly in all directions perpendicular to their direction of propagation. The strong confinement forms strong confining potential walls for photons and restricts the photons to move relatively freely only in one direction, and the waveguide is called a photonic-wire waveguide. The strong potential is necessary to affect the emission properties of the optically active layers of the waveguide core, and can be used to drastically increase the percentage of emission into one particular waveguiding mode of interest. For example, typical semiconductor waveguide core materials for use in practicing the invention have a refractive index $n_{core}$ greater than about 2.5, such as from about 3 to about 3.5 and above for InGaAsP or AlGaAs materials, whereas typical low-refractive index media for use in practicing the invention have refractive index $n_{low}$ below about 2.0, such as from about 1.6 to about 1.0 for silica or air. The ratio of the refractive indices $n_{core}/n_{low}$ has to be larger than about 1.3 to obtain substantial advantages of the invention.

The waveguide core 20 comprises an active medium 30 having major and minor sides and semiconductor guiding layers proximate the major sides to define a generally rectangular core cross-section comprising a width dimension ds and thickness dimension dw. The width dimension or direction is parallel to the substrate on which the waveguide is disposed, while the thickness dimension or direction is perpendicular to the substrate.

The strong photons confinement is provided in the width and thickness directions. The low refractive index materials described above are the materials residing on all sides 20a, 20b, 20c, and 20d of the waveguide core 20 along the width and thickness direction. A normalized width $ds_n$ greater than 0.6 and not exceeding 1.1 and a normalized thickness $dw_n$ greater than 0.1 and not exceeding 0.5 will provide optimal emission efficiency into the lowest-order guided mode, giving a Beta(space) of about 0.25 or larger. However, a normalized width of typically 1.0 and up to 4.0 and a normalized thickness of typically 0.1 up to 0.6 will still provide reasonable efficiency. A normalized thickness exceeding 0.5 and up to 1.1 and a normalized width of larger than 0.5 and less than 4.0 will still provide device of interest, although it will generally be operating with multiple waveguide modes, and will have relatively low emission into the lowest-order mode. This requirement may be relaxed to have normalized wavelength width larger than 4.0 in the case where the waveguide is in the form of a circular arc with a large curvature as described in detail below. The normalized width dimension $ds_n$ for the strong confinement direction is expressed as $ds_n = ds/ds_{lambda}$ with $ds_{lambda} = \text{Lambda}/n^s_{eff}$, where Lambda is the active-medium emission wavelength in free space (i.e. vacuum or in the absence of material medium) and $n^s_{eff}$ is the effective refractive index given by $n^s_{eff} = \text{Sqrt}(n_{core}^2 - n_{low}^2)$, where $n_{core}$ is the refractive index of the waveguide core, $n_{low}$ is the refractive index of the materials surrounding the waveguide core, and Sqrt denotes square rooting. The normalized thickness dimension $dw_n$ for this weak confinement direction is expressed as $dw_n = dw/dw_{lambda}$ with $dw_{lambda} = \text{Lambda}/n^w_{eff}$, where Lambda is the active-layer emission wavelength in free space (i.e. vacuum or in the absence of material medium) and $n^w_{eff}$ is the effective refractive index given by $n^w_{eff} = \text{Sqrt}(n_{core}^2 - n_{low}^2)$.

In a particular embodiment, the normalized width of the photonic-wire waveguide $ds_n$ is about 0.85 and the normalized thickness $dw_n$ is about 0.4 with the index ratio $n_{core}/n_{low}$ larger than 2.0.

In the limit of small enough photonic-wire waveguide core dimensions, the strong confinement of photons in the photonic-wire waveguide core will give rise to a drastic modification of the photonic density of states (quantum states for which the photons are allowed to be emitted into) in such waveguide. This drastic modification of the photonic density of states will cut off certain dipole emissions from the active medium and relatively enhances emission from one particular dipole orientation. Specifically, when the active medium is excited, the emission from the active medium can be modeled as radiation from three types of mutually orthogonal electric dipoles; namely, one type of dipole pointing in the thickness direction called the vertical dipole, one type of dipole pointing in the width direction called the horizontal dipole, and one type of dipole pointing along the axis of the waveguide (or direction of photon propagation of the guided mode) called the axial dipole. In addition to having emission from three types of dipoles (vertical, horizontal, and axial dipoles), the emission energy from each type of dipole can go either into the TE (transverse electric) polarization or the TM (transverse magnetic) polarization of the guided modes.

Normally only one of the dipole types contributes most of the energy into the guided modes of interest and the emission power from the other two dipole types is almost fully wasted. If the unused emission power from these other two dipole types can be strongly reduced, then one can save the pumping power supplied to the active medium by a factor of 60% or larger.

As part of the invention, we have found that with use of photonic-wire structure, we can substantially reduce or eliminate some of these unwanted dipole emissions, leading to a great increase in efficiency.

Via the use of photonic-wire waveguide, if the normalized width dimension $ds_n$ is larger than about 0.6 and smaller than about 0.85 (or up to about 1.1) and if the normalized thickness dimension $dw_n$ is larger than about 0.1 and smaller than about 0.5, the emission power from the vertical dipole and axial dipole can be strongly reduced. This means that most of the pumping power supplied to active medium will end up as emission power from the horizontal dipole. Furthermore, most of the power from the horizontal dipole will go to excite mainly the TE polarization modes in the waveguide. Moreover, with the chosen dimensions of $ds_n$ and $dw_n$, the waveguide can only support the lowest order guided mode, and the strong confinement in the waveguide ensures that the horizontal dipole will not radiate much to the radiation modes that escape the waveguide. Combining the aforementioned effects means that most of the emission power from the active medium will go into only one single waveguide mode, namely the lowest-order guided mode with TE polarization.

Hence, through a combination of quantum effect which strongly reduces unwanted emission from the two dipole types, and strong photon confinement which allows the emission from the remaining horizontal dipole to couple only into the guided mode and not the radiation modes that escape the waveguide, it is possible to get a huge percentage of the emission power into a single TE polarized mode of interest.

This can lead to an extremely large spatial spontaneous emission factor Beta(space) of larger than 0.30. The theoretical maximal value of Beta(space) is 0.5 due to the existence of two opposite directions of propagation for the waveguide modes (i.e. at most only half the emitted power can go into one of the propagating mode directions). Hence, the Beta(space) value for the photonic-wire waveguide is close to the ideal value of 0.5. This is much larger than the Beta(space) value of a typical conventional ridge waveguide used in a typical light-emitting device, for which Beta (space) is about 0.004.

The extremely large Beta(space) value leads to a significantly enhanced optical gain for the active medium and efficiency for the conversion of the pumping power, which makes it possible to achieve lasing with a small cavity. In this invention we have realized such a photonic laser and show that lasing can be achieved in a microcavity with an extremely small cavity volume of less than 0.3 cubic micrometers or $10^{-18}$ cubic meters, which is about the smallest cavity ever made to lase. We also show that in a particular realization the pumping threshold needed for lasing in such a small cavity can be as low as 100 microWatts, which is about 100 times lower than the threshold pumping power for a typical 300 micron long semiconductor laser.

When the dimensions of the photonic-wire waveguide are larger than the above prescribed dimensions, the spontaneous emission coupling efficiency into the lowest-order spatial mode of opportunity is approximately:

Beta(space)=$\cos_{-1}(1-1/rs)*\cos_{-1}(1/rw)/(3\ pi^2*fw*fs)$
where fw=$dw_n$ if $dw_n$ is greater than $1/Sqrt(3)=0.577$ and fw=1 if $dw_n$ less than $1/Sqrt(3)$, and fs=$ds_n$ if $ds_n$ is greater than $1/Sqrt(3)$ and fs=1 if $ds_n$ less than $1/Sqrt(3)$ where Sqrt is square root and where $\cos^{-1}$ is the inverse cosine or arc-cosine and rs=$n_{core}/n_{low}$ and rw=$n_{core}/n_{high}$. The Beta (space) defined is a function of emission captured spatially into one particular polarization (TE and TM) of the lowest-order guided mode that is propagating in a particular direction of propagation of the waveguide (these are two mutually opposite directions for which a wave can propagate in the wave guide). The above formula gives a good estimation of Beta(space) generally except in structures where $ds_n$ is less than 0.5 or $dw_n$ is less than 0.6. When $ds_n$ is less than 0.5, for example, emission into one of the two polarizations may be cutoff, leading to a factor of 2 increase in the Beta(space) factor for the remaining polarization. When $dw_n$ and $ds_n$ are both less than 0.1, emission may be reduced or cutoff, leading to a drastic decrease in the Beta(space) value. A more exact value for Beta(space) can be calculated based on quantum electrodynamic calculations which can deviate (typically larger) from this simple estimation by a few times especially for the case where $ds_n$ or $dw_n$ isless than 0.5.

This Beta(space) value of up to about about 0.3 and higher attributed to the photonic-wire waveguide core in accordance with the present invention is substantially larger than that of the typical semiconductor laser waveguide structure with Beta(space)=0.004.

Moreover, this large Beta(space) value coupled with the high Q value micro-cavity design for which Beta(Freq) is close to 1, provides Beta(tot) up to about 0.03 for the waveguide core in accordance with the present invention, which is much larger than the Beta(tot) factor of typical semiconductor laser waveguide structure with Beta(tot)= 0.00001. The Beta(tot) will still be as large as 0.0035 (350 times larger than that of the typical semiconductor laser structure) even when the cavity is not at the ideal microcavity limit but is reasonably "micro" so that Beta(Freq) is greater than 0.05.

A reasonable microcavity with Beta(Freq) greater than 0.05 can be achieved by closing the photonic-wire waveguide 12 on itself to form a small closed loop cavity. Let the cavity's physical length be denoted by Lc and the effective propagating refractive index for mode in the cavity be denoted by $n_c$ ($n_c$ is closely approximated by $n_{core}$ except when ds is small so that $ds_n$ is less than 1.0 at which $n_c$ can fall substantially below $n_{core}$). The normalized cavity length is defined by Lcn=Lc/(lambda/$n_c$). A normalized cavity length of typically 300 or smaller is needed to achieve Beta(Freq) of about 0.05 and larger (assuming the emission width of the optically active medium is about $10^{13}$ Hertzs (or 70 nanometers), which is typical for that of a quantum well emitting at 1.5 microns, Lcn=300, and $n_c$=2.4 (for $ds_n$=0.3), gives dfe=$10^{13}$ Hertzs, dfc=$1.7*10^{12}$ Hertzs, and Beta(Freq) =0.05.

Generally, the microcavity with cavity Lc specified above provides a Beta(Freq) of about 0.05 and larger when the emission frequency width from the active medium is equal to about 1⁄20 of the optical emission frequency exhibited by semiconductor quantum wells.

One particular embodiment of the invention with near optimal properties for operation at 1.1 microns to 1.6 microns wavelength range employs dimension ds that is about 0.6 micron or smaller and dimension dw that is 0.3 micron and smaller with ds being larger than about 0.2 micron and dw being larger than about 0.03 micron.

Another particular embodiment of the invention for operation at 0.2 micron to 0.7 micron wavelength range employs a dimension ds that is about 0.3 micron or smaller and dimension dw that is about 0.3 micron and smaller with ds being larger than about 0.04 micron and dw being larger than about 0.01 micron.

Still a further particular embodiment of the invention for operation at 0.6 micron to 1.0 micron wavelength range employs a dimension ds that is about 0.4 micron or smaller and dimension dw that is about 0.2 micron and smaller with ds being larger than about 0.1 micron and dw being larger than about 0.02 micron.

Figure 3:
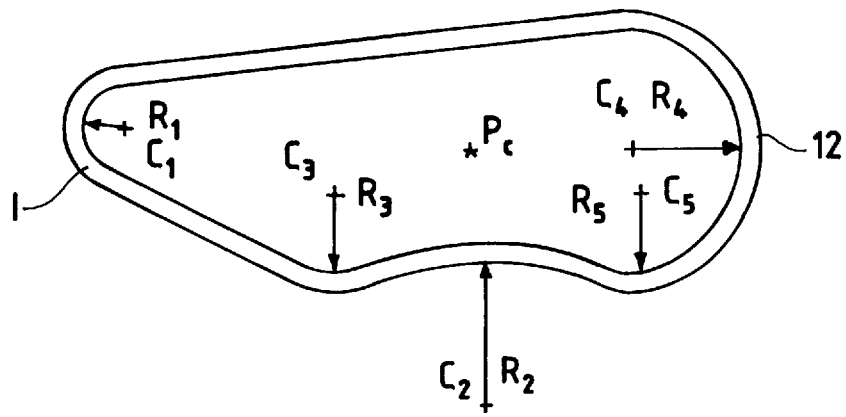
FIGS. 3, 4, 5, and 6 are schematic views of variations of closed loop waveguides.
Figure 4:
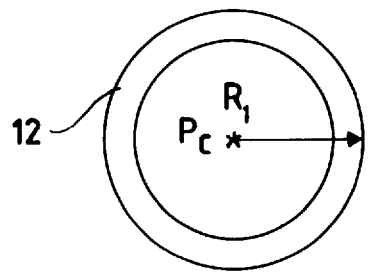
Figure 5:
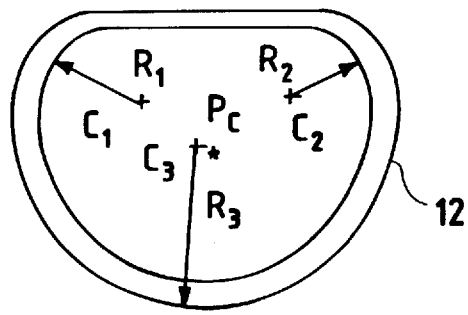
Figure 6:
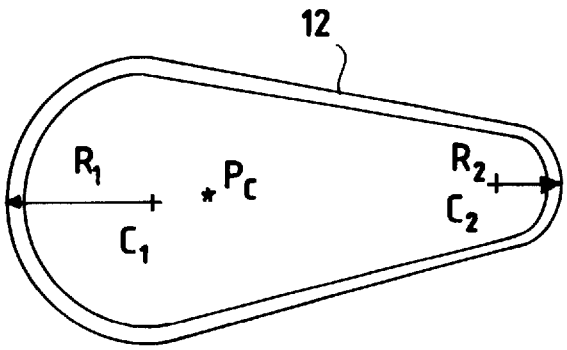

The general design for such high-Q cavity is illustrated in FIG. 3, which schematically shows a cavity formed by a closed loop of photonic-wire waveguide 12 with one or more arcuate shapes or one or more linear shapes, or combinations thereof. Each arcuate segment can be formed by one or more circular segments or some times by many linear segments of sufficiently short lengths joined to each other with a small bend. The simplest design involves no linear section and is in the form of a perfect circle as shown in FIG. 4. A more complicated variation consisting of an arcuate segment and a linear segment is shown in FIG. 5, while a variation consisting of two arcuate segments and two linear segments are shown in FIG. 6.

In order to achieve low loss and hence high Q for the cavity, the curvature of the arcuate segments cannot be arbitrary but must satisfy a minimal radius of curvature. In addition, two adjacent segments joined to each other must have the same tangents for their line sections at the joint. For the sake of defining the radii of curvature of the arcuate segments, each arcuate segment will be approximated by one or more circular segments. High accuracy of approximation is achieved when the error of approximation involves spatial deviations smaller than one tenth the optical wavelength of emission in the photonic-wire waveguide. The outer rim of each such circular segment is formed by a circular arc drawn with a certain radius of curvature R from a certain center C. We can label the Rs and Cs of all such circular segments in FIG. 3 by R1, R2, etc. and C1, C2, etc., respectively, which will be referred to as their radii and centers of curvature.

If the center of curvature Ri (i=1,2, etc.) for arc i is too small, photons in the photonic-wire waveguide can escape from the waveguide and radiate in a direction away from the center of curvature. This will result in cavity photon loss and hence low cavity Q value. To avoid loss, the design requires that:

$|Ri| > \sim [\text{lambda}/(2\pi)] * \text{Ln}[\text{lambda}/(2\pi n_{core} L_{arc})]/\text{Ln}[n_{core}/n_{low}]$ where $L_{arc}$ is the length of the circular arc and Ln is the Natural Logarithm. For the purpose of illustration, it is necessary to specify if the curved arc is around the center designated $P_c$ or away from the center. If it is around the center, Ri is assigned a positive sign and if it is away from the center, Ri is assigned a negative sign.

More specifically, let point Pc be a point in the center region of the closed loop, we will assign Ri (i=1, 2, etc.) for arc i to be positive if its center of curvature Ci lies on the same side of arc i as point Pc, and negative (i.e. Ri=|Ri|) if its center lies on opposite side of the arc i as point pc. For the general case in FIG. 3, Ri can either be positive or negative (e.g. R2 is negative).

Lasing threshold is achieved when the round trip optical gain of the electromagnetic field mode propagating in the cavity due to the excited active layer exceeds the round trip optical loss. The round trip loss can be due to absorption and scattering by impurities or defects in the waveguides, as well as roughness on the waveguide side walls. It can also be due to photons leaking out to the output-coupled waveguide described below.

Figure 10:
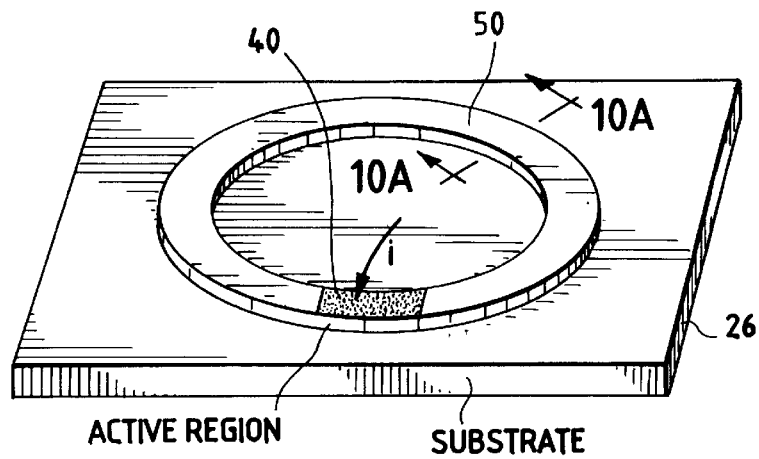
FIG. 10 is a perspective view of a photonic-wire waveguide of still another embodiment of the invention illustrating local electrical pumping thereof by current ic.
Figure 10A:
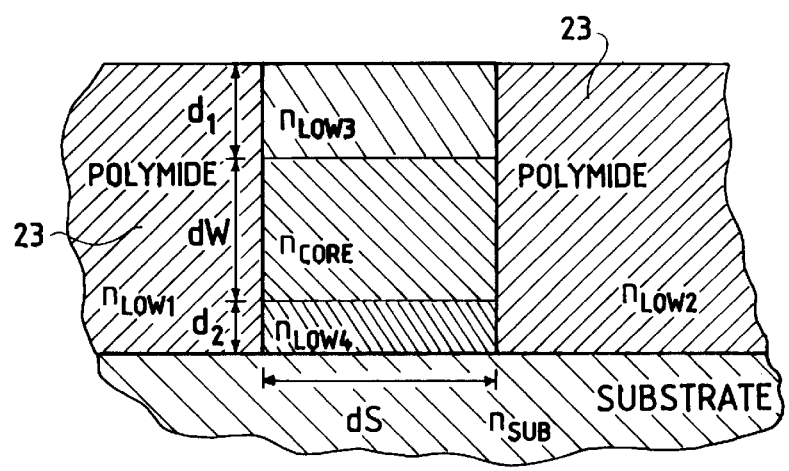
FIG. 10A is a partial cross-sectional view at a location through the waveguide of FIG. 10 at the encircled region.
Figure 10B:
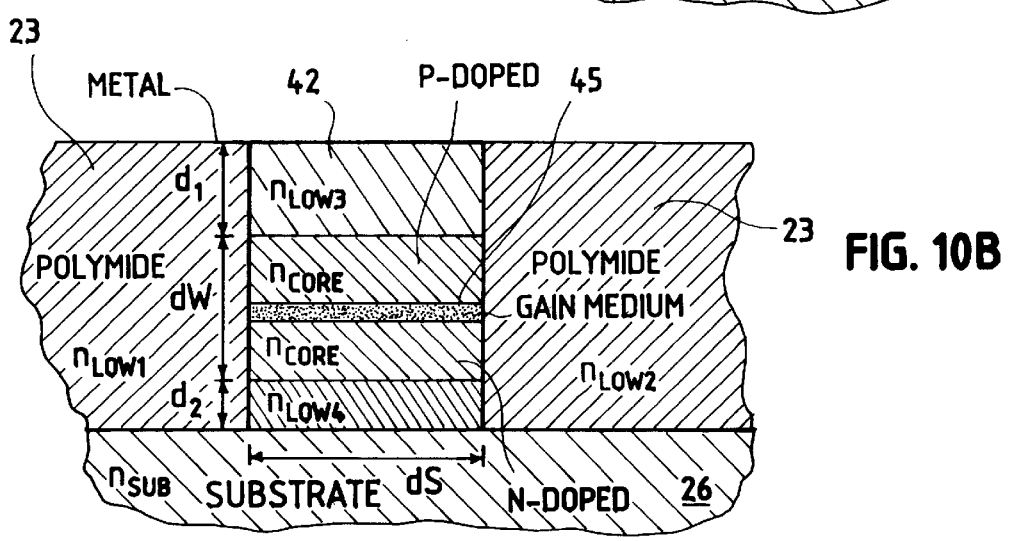
FIG. 10B is a partial cross-sectional view at another location through the waveguide of FIG. 10 at the encircled region showing a p-n junction for electrical pumping.

The pumping power needed to achieve lasing threshold is partially used to cause inversion in the active layer at which the active medium will become transparent and begin to contribute to optical gain. This is called the transparency pumping power. It is partially used to achieve additional gain above the transparency point so as to overcome the cavity loss as described above. This is called the additional-gain pumping power. Due to the high Q, low loss nature of the cavity, the additional-gain pumping power may be a small part of the total threshold pumping power. In that case, most of the threshold pumping power is used to make the medium transparent (i.e. used as transparency pumping power). The transparency pumping power needed is proportional to the total material volume of the active medium. It can be reduced by using thinner active medium or by reducing the area of the active medium in the cavity. Hence, the threshold pumping power may be reduced by having the active medium present only along a small section of the entire length of the waveguide that forms the cavity (this is illustrated in FIGS. 10, 10A, and 10B where a small section 40 of the waveguide has a photonic-wire structure 42 with an active medium 45, while the remaining length of the waveguide 50 that forms the cavity (40 and 50) has a photonic-wire waveguide structure 52 sans an active medium.

To reduce side-wall scattering loss, it is in general desirable that the side walls of the photonic-wire waveguide core, especially the two side walls 20a, 20b for the strong photon confinement in the width direction, be fabricated with smooth surfaces having roughness less than one tenth of lambda/$n_{core}$. Power loss due to side-wall scattering loss is also dependent on the refractive index difference between the waveguide core and the surrounding materials, or specifically directly proportional to $(n_{core}^2 - n_{low}^2)^2$.

Thus, reducing the refractive index difference between the waveguide core and the surrounding materials can reduce the scattering loss. However, as described above, it will trade-off (i.e. reduce) the efficiency of emission given by Beta(Freq), which is also dependent on the refractive index difference. These considerations must be taken into account in the design and fabrication of the cavity.

The requirement of smooth waveguide side walls, however, can be relaxed for those highly curved arcuate segments where the Ri's are small. In that situation, as explained below, it may actually be desirable to have roughness fabricated on some of the side walls to enforce lasing in the lowest-order guided mode.

Figure 7:
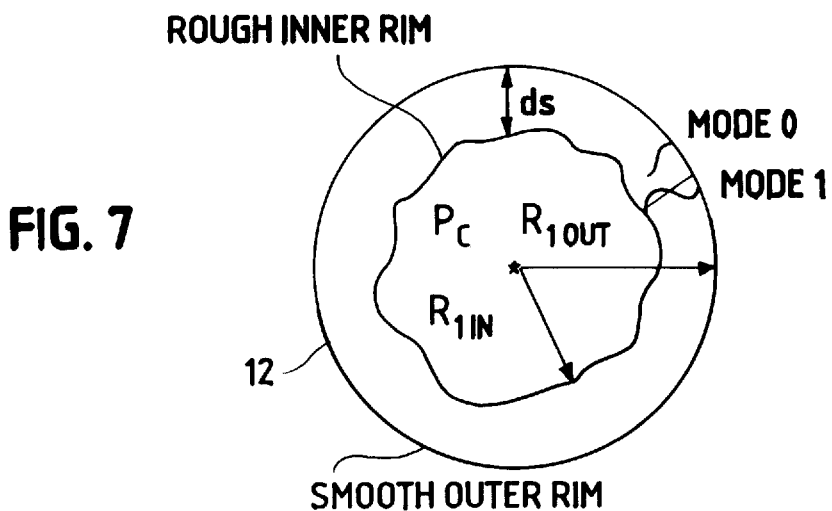
FIG. 7 is a schematic view of a cavity formed with a circular, annular-shape photonic-wire waveguide with roughened side walls.
Figure 7A:
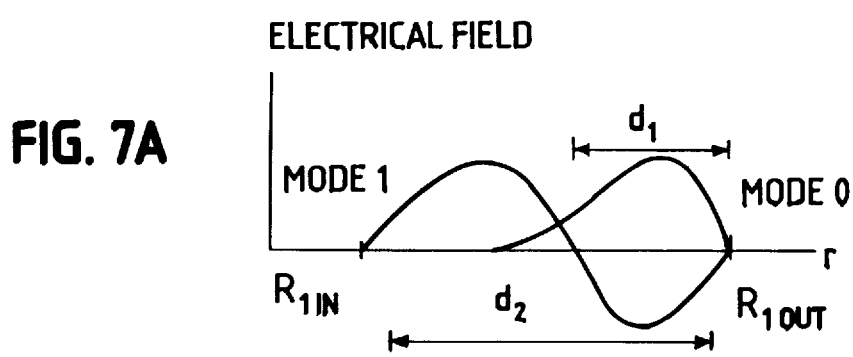
FIG. 7A is a view illustrating electric field mode relative to radius of curvature of FIG. 7.

The situation is illustrated for the simplest case of a circular, annular core cavity in FIG. 7. When the radius of curvature R1 in FIG. 7 is smaller than approximately 50 times the optical wavelength in the waveguide core 20 (i.e. R1 less than 50 lambda/$n_{core}$), the strong curvature can cause the guided modes to squeeze towards the outer rim of the waveguide core as shown by the guided mode cross-section in FIG. 7A. The outer or inner rim of a curved segment is the side wall (20a or 20b) of the photonic-well waveguide that is respectively closer to or farther from the segment's center of curvature. Generally, the large curvatures squeeze the mode width of the lowest-order mode to less than about ten optical wavelengths in the photonic-wire waveguide, and force it to porpagate along the outer rim of the curved waveguide. In particular, the lowest-order mode (mode 1) is squeezed to a mode width $d_1'$ of less than 10 lambda/$n_{core}$. If the waveguide width ds is larger than the mode width $d_1'$, the lowest-order mode will touch mainly the outer rim of the curved waveguide due to centrifugal force on the photons undergoing curvilinear propagation. The higher-order modes, such as the second-order mode 2, will have a mode width $d_2'$ larger than $d_1'$ and will touch more of the inner rim of the curved waveguide. As a result, roughness along the inner rim of the waveguide will cause much more loss to the higher-order modes than the lowest-order modes, and will eliminate lasing in the higher-order modes when sufficient loss is imposed.

The waveguide width ds typically is larger than the lowest-order mode of propagation and at least a portion of an inner rim of the closed loop is roughened to increase scattering loss on higher-order modes.

Figure 8:
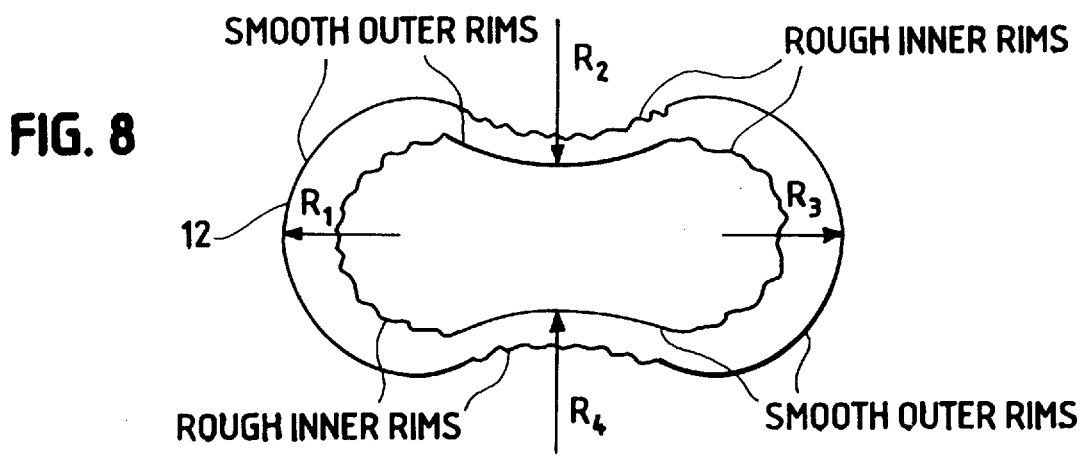
FIG. 8 is a schematic view of another cavity formed with a closed-loop photonic-wire waveguide with roughened side walls.

The general case is shown in FIG. 8 for which there are multiple arcuate segments forming a closed loop cavity. In order for this configuration to work, it is desirable that every segment with substantial segment length has a radius of curvature Ri smaller than 50 times the optical wavelength in the waveguide core (i.e. Ri less than 50 lambda/$n_{core}$). Straight segments can be viewed as curved segments with an infinite radius of curvature and are not desirable to be present in this scheme. The waveguide width ds must be larger than the mode-width $d_1'$. A typical design has its normalized waveguide width $ds_n$ to be larger than 0.1 but smaller than approximately 10.0. For each segment, roughness can be present on the rim closer to its center of curvature. To eliminate lasing in the higher-order modes, roughness present on some portions of segment length may be sufficient (i.e. not the entire length must have roughness present on such side walls).

Note that since the lowest-order mode is squeezed to the outer rim and to a normalized mode-width of less than 10.0, the position of the inner rim would have no significant affect on its mode width if distance between the outer rim and inner rim is larger than the mode width $d_1'$. In fact, in that case, the clear presence of the inner rim is not needed and the waveguide region beyond a distance of about $d_1'$ away from the outer rim can take on different physical forms such as different thicknesses or sidewall roughness without affecting the mode confinement or performance of the device. Hence, the waveguide normalized width $ds_n$ can be 10.0 or larger without affecting the waveguiding or gain of the lowest-order mode significantly from the case where $ds_n = 10.0$. Thus, in this situation we can relax $ds_n$ to have a large value limited only by the allowed diameter of the cavity size such as 100, at which the curved waveguide will have a radius of curvature of 50 lambda/$n_{core}$. Thus, $ds_n$ can be larger than 0.1 and less than 100. In practice, as the lowest-order mode only occupies a small region close to the outer rim, it is economical to keep $ds_n$ to be around 4.0 or smaller such as to reduce the area of the active medium which can draw additional pumping power.

Optical coupling of the device described hereabove to an output can be effected by a light output-coupled waveguide W proximate a portion of the periphery of the waveguide core 20 in a manner to achieve resonant photon tunneling. The waveguide W is spaced by a small gap of low refractive index material (e.g. air) from the photonic-wire waveguide 12. The coupling involves a short section of the cavity and the waveguide W in which the photons in the cavity are propagating in parallel to each other. The refractive index of the gap region is lower than the refractive indices of the waveguide material and cavity material. The gap size typically is smaller than 10 and larger than 0.02 optical wavelength in the photonic-wire waveguide. The amount of coupling or energy transfer between the output-coupled waveguide W and the waveguide core 20 increases with decreasing gap size or increasing coupling length, where the coupling length is the length for which the output-coupled waveguide W proximates the waveguide core 20.

Figure 11:
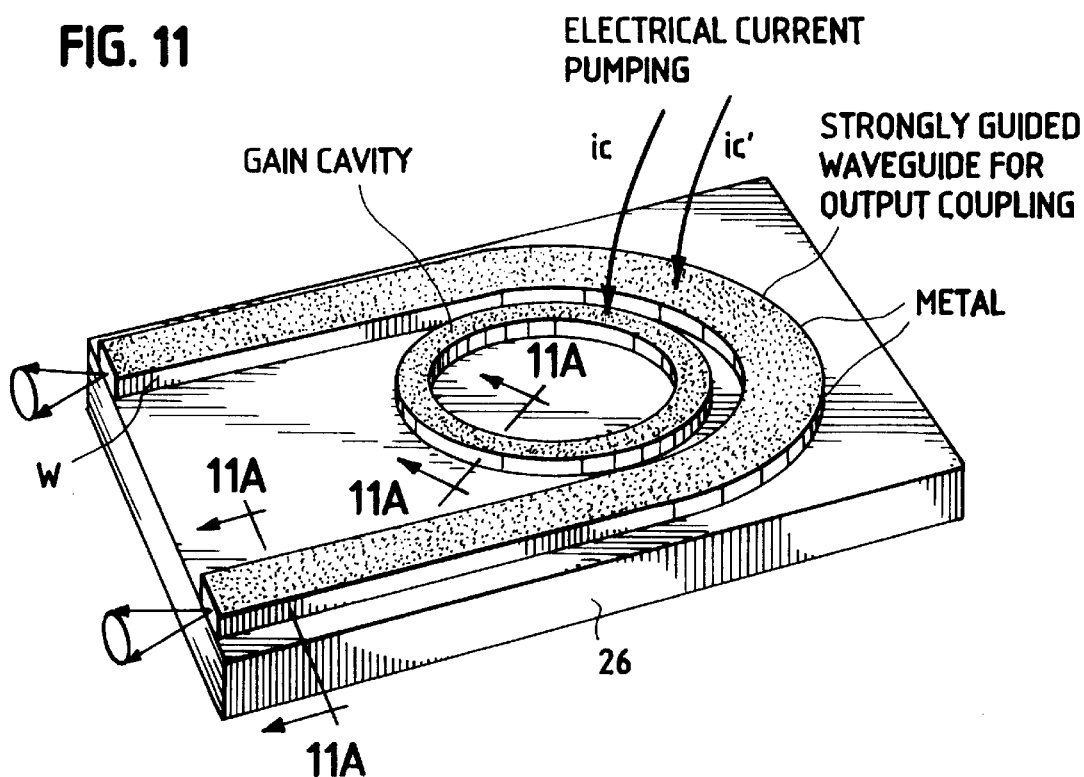
FIG. 11 is a perspective view of an electrically pumped photonic-wire waveguide (current ic) and output-coupled waveguide (current ic') of yet another embodiment of the invention.
Figure 11A:
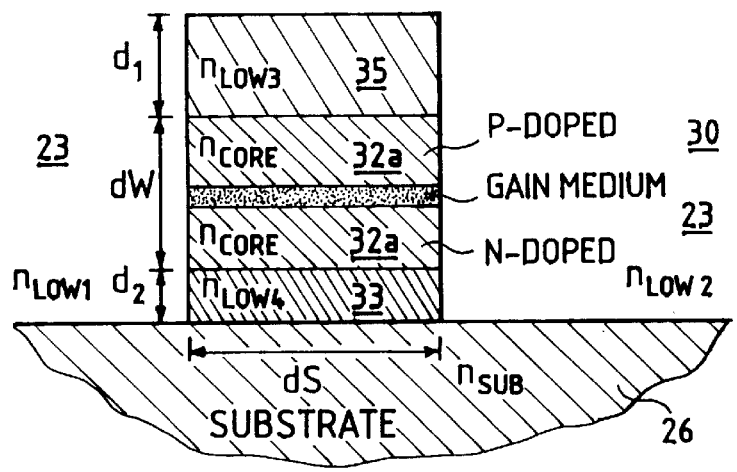
FIG. 11A is a partial cross-sectional view at a location through the waveguide of FIG. 11 at the encircled region.
Figure 12:
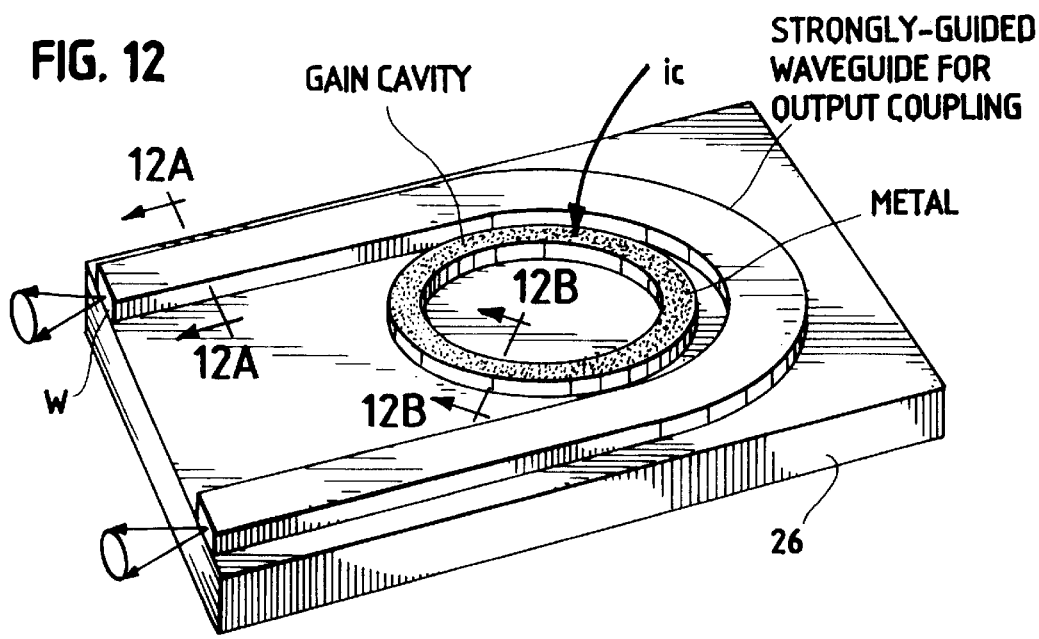
FIG. 12 is a perspective view of an electrically pumped photonic-wire waveguide of still another embodiment of the invention.
Figure 12B:
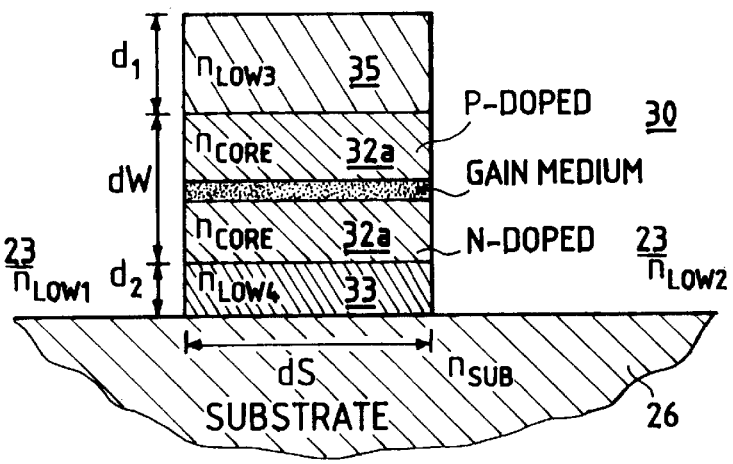
FIG. 12B is a partial cross-sectional view at a location through the photonic-wire waveguide of FIG. 12 at the encircled region.
Figure 12A:
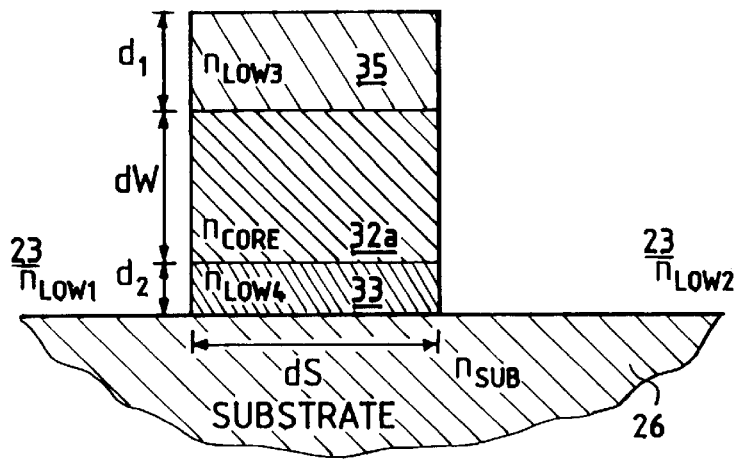
FIG. 12A is a partial cross-sectional view at a location through the output-coupled waveguide of FIG. 12 at the encircled region.

The vertical structure in the thickness dimension of the output-coupled waveguide W can be the same as that of the laser cavity. In that case, it has to be excited by optical or electrical pumping to avoid absorption of light by the unexcited active medium in the waveguide as illustrated in FIG. 11. To avoid the need for pumping the output-coupled waveguide W, its vertical structure may be the same as that of the laser cavity but without the active materials as illustrated in FIGS. 12, 12A, and 12B. The output-coupled waveguide can be formed at a level on a substrate 26 compatible with an integrated optical circuit IC present on the substrate so as to provide light output signals to the optical circuit.

Figure 13:
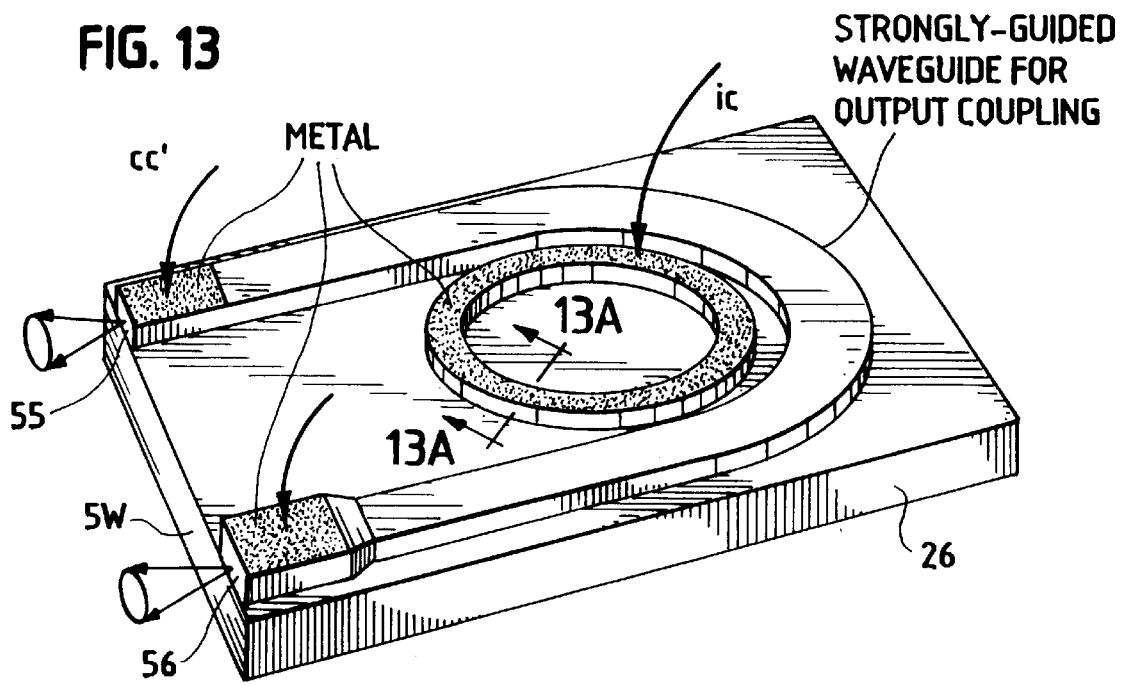
FIG. 13 is a perspective view of an electrically pumped photonic-wire waveguide of yet an additional embodiment of the invention illustrating local electrical pumping of the output-coupled waveguide (current ic').
Figure 13A:
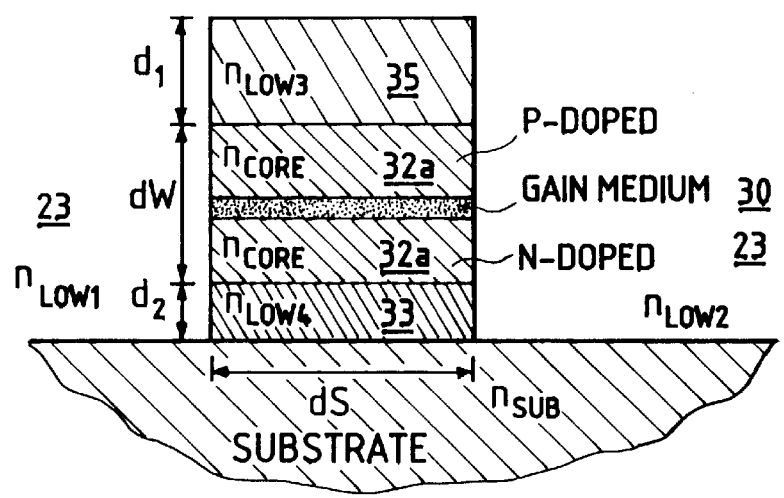
FIG. 13A is a partial cross-sectional view at a location through the waveguide of FIG. 13 at the encircled region.

The output-coupled waveguide W can also have active materials present only along certain sections of the waveguide as illustrated by sections 55 and 56 of FIG. 13. The sections 55, 56 with active materials can be pumped to achieve population inversion, giving rise to optical gain for light propagating in the waveguide W. This can be used to provide further amplificaton of optical power from the cavity, FIG. 13A, leading to a higher net optical power in the waveguide.

If the active medium section is not pumped, it can function as a detector in the following manner. It can absorb light in the waveguide which will cause population excitation of the active medium in proportion to the light power absorbed. The population excitation can be detected for example via a closed electric circuit, leading to a circuit current. The circuit current is then an indication of the optical power in the waveguide. The active medium section can also function as a modulator by modulating the pumping power, leading to a modulation of optical absorption or gain of the active medium section an d hence the optical power through the section.

Figure 14:
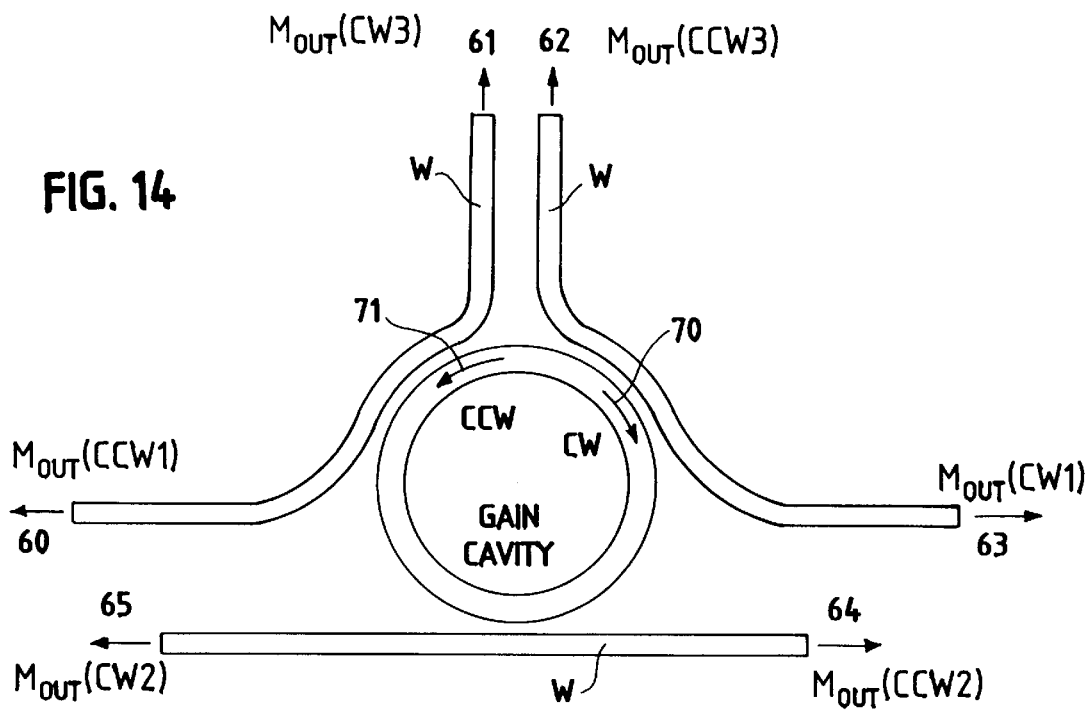
FIGS. 14 and 15 are schematic views of a photonic-wire waveguide coupled to a plurality of output-coupled waveguides pursuant to still another embodiment of the invention.

The cavity may be coupled to one or more output-coupled waveguides W at different segments of the cavity as illustrated in FIG. 14, providing six output ports 60, 61, 62, 63, 64, and 65. It must be noted that light in the closed loop cavity may be divided into two beams, one that propagates in the clockwise direction 70 and one that propagates in the counterclockwise direction 71. One or both of the beams may be brought above lasing threshold via external pumping.

Figure 15:
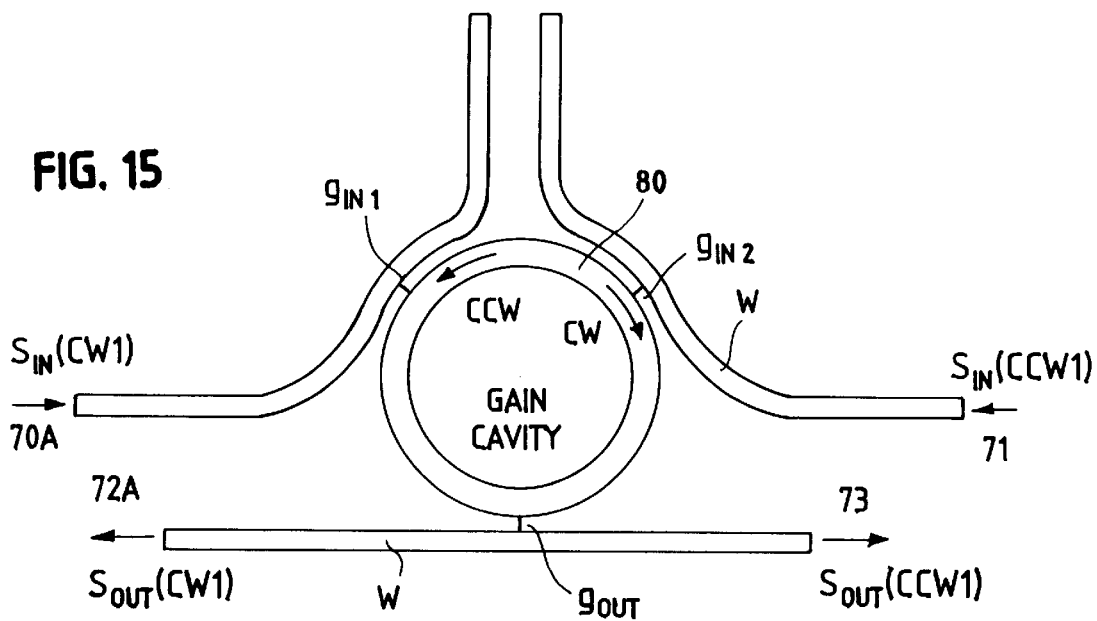

The output-coupled waveguide W may also serve to couple light from other light source or another such photonic-wire light-emitting device, into the cavity, thereby forming input ports to the cavity. This is illustrated in FIG. 15 where two input ports 70a, 71 and two output ports 72a, 73 to cavity 80 are shown.

The input ports are used to introduce light in the form of pulses or continuous wave beams into the cavity, which can affect the properties of light output from the cavity. In particular, the amplitudes, phases, frequencies, pulse duration, and polarization of the light output from the output ports can depend on the amplitudes, phases, frequencies, pulse duration, and polarization of the light input into the input port. The dependence can be different depending on the excitation level or population inversion of the active medium in the cavity, or on whether the input beams in the cavity are brought above or below the lasing thresholds.

This dependence comes about through the mechanisms of injection locking and light transmission through a nonlinear optical cavity as is known for which light injected into a cavity can change properties of light in the cavity in terms of amplitudes, phases, frequencies, pulse duration and polarization thereby leading to a change in the properties of the output light from the cavity. A change in the population excitation of the active medium in the cavity can lead to the change of cavity gain or loss, and the refractive index in the cavity, thereby affecting the mechanism of injection locking or light transmission through a resonant cavity, which then affects the properties of the output light.

Such input-output dependence can be used for processing signals or information coded in the properties of the input light beams, and can be a useful device for application to optical communications, optical interconnects, optical sensing, optical signal processing, and optical computing.

The presence of both input and output ports allows two or more of the photonic-wire cavities to connect to each other by connecting the output port(s) of one cavity to the input port(s) of the other cavity. This allows one to build up a circuit comprising one or more of such cavities, which by itself can be a high-density photonic-wire integrated circuit.

The properties (amplitudes, phases, frequencies, pulse duration and polarization) of the output beams from the output ports can be changed (or modulated) by changing the excitation level of the active medium via modulating the pumping power supplied to excite the active medium, such as the external injection current ic to the active medium when electrically pumped. Such modulation can be generally imposed at high rate or frequency if the Beta(tot) value of the cavity is high, especially when operating at above lasing threshold.

Figure 9:
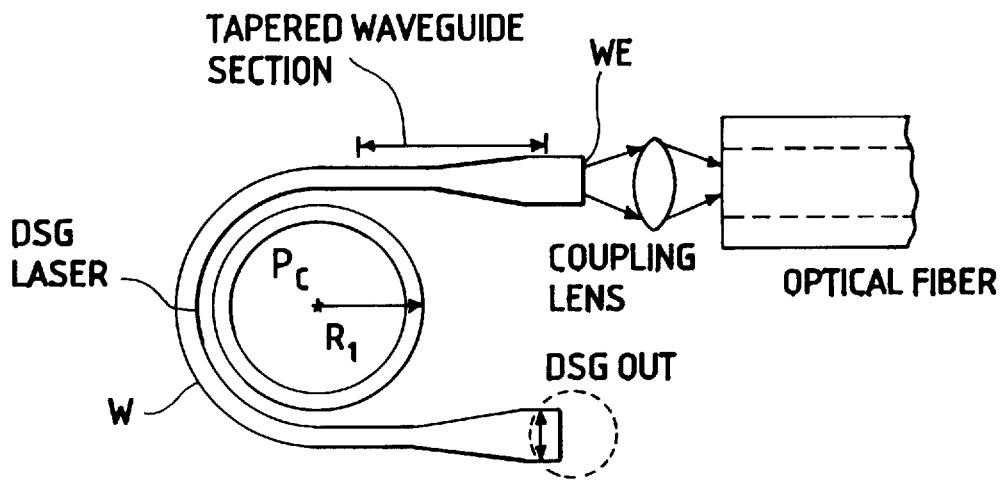
FIG. 9 is a schematic view of a photonic-wire light emitting device and a U-shaped output-coupled waveguide, optical lens and optical fiber pursuant to an embodiment of the invention.

A typical single device useful for practical applications can consist of a laser cavity formed by waveguide 12 coupled to a U-shaped output-coupled waveguide W as shown in FIG. 9. In order to achieve resonant photon tunneling of photons, the mode width for the electromagnetic field mode propagating in the output-coupled waveguide W must be close or similar to the mode width for the electromagnetic field mode propagating in the cavity. This will ensure that the field modes propagating in the output-coupled waveguide and the laser cavity have similar spatial width or propagating velocities so that they can couple to each other with maximal efficiency.

Figure 9A:
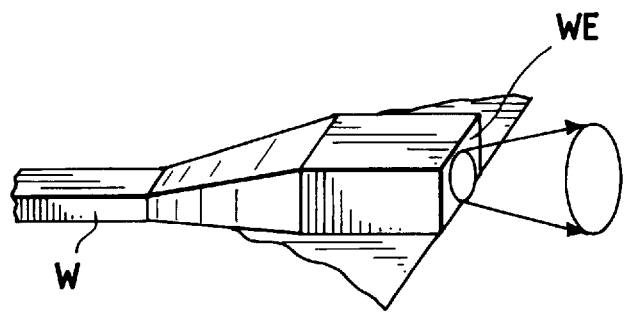
FIG. 9A is a perspective view of a portion of FIG. 9.

By cleaving the ends WE of the U-shaped waveguide W shown in FIG. 9, laser light radiation into free-space (i.e. air) can be obtained. The spatial mode profile in the width direction and thickness direction is determined by the width and thickness of the output-coupled waveguide, which can be changed at the ends via tapered waveguide sections shown FIG. 9A. Thus, the waveguide width $dsg_{laser}$ and thickness $dwg_{laser}$ at the laser is chosen to achieve maximal coupling of light, while the waveguide width $dsg_{out}$ and thickness $dwg_{out}$ at the end WE is chosen to achieve a certain spatial profile for the light output. In particular, the spatial mode profile of the free-space radiation mode in the width direction can be made to have the same size as the spatial mode profile in the thickness direction, thereby achieving a near circular output spot size. Circular output spot size is generally desirable to achieve efficient coupling into an optical fiber via use of the coupling lens as shown in FIG. 9.

For purposes of illustration and not limitation, the photonic-wire light emitting device having the dimensions described above can be formed by a fabrication process involving nanofabrication techniques including electron-beam (e-beam) lithography and reactive ion etching (RIE). For example, an InP substrate can be coated with an epitaxial InGaAsP/InGaAs laser layer structure of 0.19 micron thickness. Within the layer structure, three 100 Angstrom thick quantum well layers ($In_{0.53}Ga_{0.47}As$) can be separated by 100 Angstrom thick guiding or barrier layers ($In_{0.84}Ga_{0.16}As_{0.33}P_{0.67}$). They can be sandwiched by two 700 Angstrom thick ($In_{0.84}Ga_{0.16}As_{0.33}P_{67}$) guiding or barrier layers on both sides.

A wafer bonding and etching technique can be used to transfer the thin waveguide core 20 on top of a low index $SiO_2$ cladding or medium on a GaAs substrate. First, 800 Angstrom thick $SiO_2$ is deposited on a wafer via plasma enhanced chemical vapor deposition (PECVD). Electron-beam lithography is used to write the core pattern on PMMA (poly methyl methylmethacrylate) coated on top of the $SiO_2$ layer. The pattern then is transferred down to the $SiO_2$ layer by etching away the unmasked region using the RIE process with $CHF_3$ as the etchant gas under 31 millitorrs with 60 Watts plasma power and then the PMMA is removed. The pattern in $SiO_2$ layer then forms the mask for subsequent etching of the InGaAsP layer. The RIE process is used to etch the structure down vertically through the 0.19 micron InGaAsP/InGaAs epitaxial layer structure into the InP substrate. In this step, a gas mixture of methane, hydrogen, and argon can be used in a ratio of 10:34:10 under a gas pressure of 45 millitorrs and a plasma beam power of 90 Watts plasma power.

In order to achieve placement of the thin annular waveguide core 20 on a low-refractive index material, the substrate is removed as follows. The RIE etched sample is deposited with 0.75 micron thick $SiO_2$ using PECVD. A piece of GaAs substrate covered with 0.75 micron thick $SiO_2$ deposited via PECVD is then prepared. The two substrates are $SiO_2$ face-to-face bonded together using acrylic. Finally, a highly selective HCl etchant (HCl plus $H_3PO_4$ in 1:1 ratio) was used to remove the InP substrate, leaving the photonic-wire light emitting structure on 1.5 micron thick $SiO_2$ on the GaAs substrate.

For purposes of further illustration and not limitation, photonic wire lasers were made as described above with an outer diameter of 4.5 micron s and with a waveguide thickness of dw of 0.19 micron. These lasers were made with waveguide widths of ds of 0.25 micron and 0.4 micron. The photonic wire lasers so made were optically pumped with a 514 nanometer argon-ion laser modulated with 1% duty cycle in a vacuum-assisted Joule-Thomson refrigerator at 85K. The beam was focused with a 40× microscope objective lens to a size larger than the size of the waveguide core. The scattered output was collected from the top of each waveguide core via the objective lens and dispersed by an optical grating spectrometer (resolution of 1 nanometer) and detected using a lock-in technique and a liquid-nitrogen cooled germanium detector.

Figure 16:
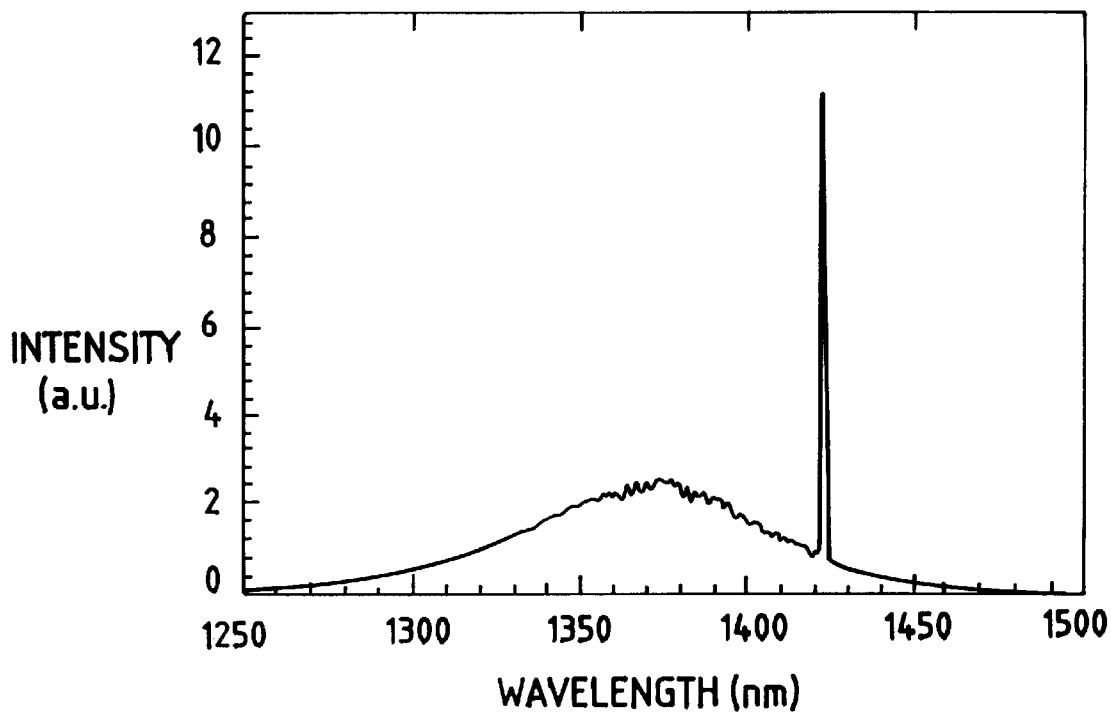
FIG. 16 is graph of intensity versus wavelength.
Figure 16A:
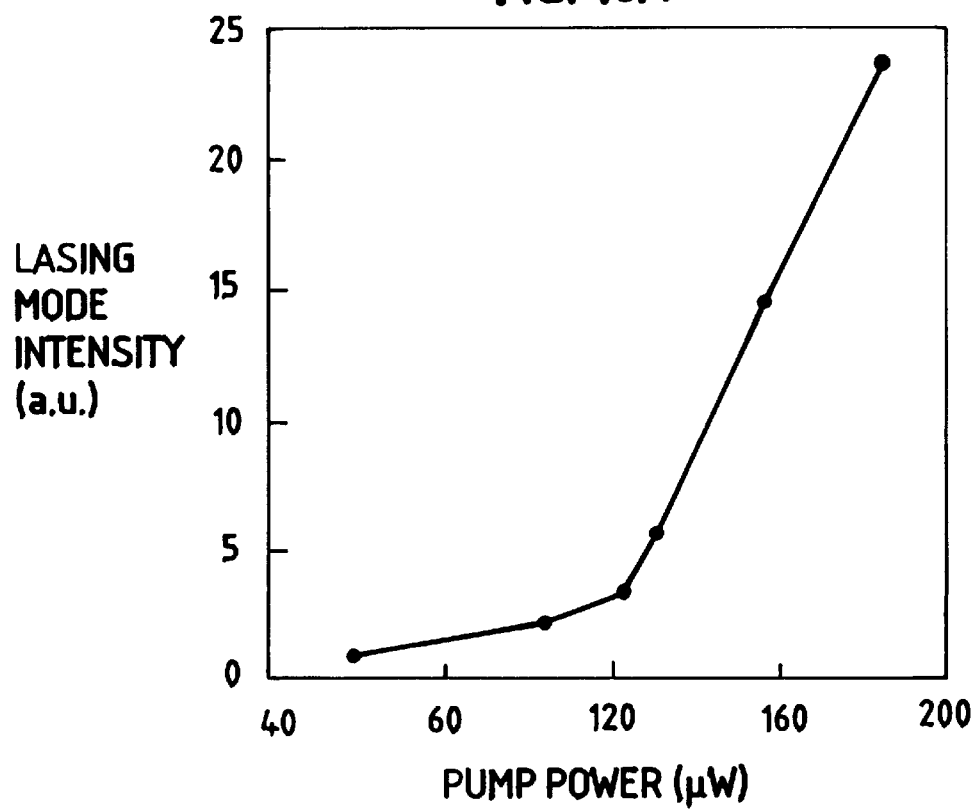
FIG. 16A is lasing power versus peak pump power.

FIG. 16 shows the typical lasing spectra obtained from the photonic-wire laser of the invention with a waveguide with a width of 0.4 micron and thickness of 0.19 micron pumped by a 514 argon-ion laser modulated with a 1% duty cycle in a vacuum-assisted Joule-Thomson refrigerator at 85K. FIG. 16 indicates lasing at 1403 nanometers (nm). The dashed curve is the spectrum at around the lasing threshold where the peak pump power absorbed by the laser is approximately 95 microWatts. The lasing power as a function of the peak pump power is shown in the inset designated FIG. 16A. Its spectral linewidth at 1.5 threshold was measured to be about 0.5 nm with a spectrum analyzer resolution of 0.1 nm. The cavity Q value was estimated to be Q=300 from the emission linewidth of the enhanced photo luminescence below lasing threshold near the cavity resonance. This corresponds to a waveguide loss of 2% per round trip primarily due to the average surface corrugations of about 0.002 micron s on the etched waveguide sidewalls.

The small area (cross-sectional area of 0.02 microns squared) of the photonic-wire laser provides a large, spontaneous emission coupling efficiency of about 35%. The mode volume of this laser was only 0.27 micron s cubed, and the total material volume was only 1 micron cubed.

While FIG. 16 indicates that the photonic-wire laser of waveguide width of 0.4 micron lased at 1403 nm, the photonic-wire laser having a waveguide width of 0.25 micron did not lase under the same excitation conditions described above. The lack of lasing was attributed to suppression of the emission into the lowest order guided ode when $ds_n$ is about 0.65 micron (actual ds of approximately 0.3 micron ). The large drop in emission into the lowest-order guided mode is attributed to a large plunge in the photon density of states as well as an increase in the mode area at the very small waveguide dimensions, although Applicants do not wish or intend to be bound by any theory in this regard. As the waveguide width dimension of 0.25 micron creates ds approximately equal to dw less than 0.65 micron, the laser structure will have a low gain, and hence cannot lase. These results indicate that photonic-wire lasers of the invention have a minimum waveguide cross-sectional area below which the Beta value can become small and lasing will cease. Thus, the photonic-wire lasers of the invention must have a waveguide cross-sectional area greater than this minimum value.

Although the active medium materials is shown in the form of layer with a width equal to the waveguide width, those skilled in the art will recognize that the specific shape and dimensions of the medium can vary and the gain provided by the medium is dependent mainly on its volume of occupation being primarily at the center region of the cross-section of the waveguide core.

Although the low refractive index materials 23 and low refractive index materials 30, 32 are described as having a particular refractive indices, those skilled in the are will recognize that they are used to indicate the typical refractive indices possessed by these materials. For example, with in each material, it is possible to have small refractive index fluctuations or variations spatially without affecting the mode confinement in the waveguide core or the performance of the device.

Although the waveguide core 20 is shown with a rectangular cross section, those skilled in the art will recognize that the core shape can deviate from a perfect rectangular shape with an averaged thickness and width dimension of the invention and as set in the appended claims with regard to mode confinement and the performance of the device.

Although the invention has been described with respect to certain specific embodiments thereof, those skilled in the art will recognize that these embodiments are offered for purposes of illustration rather than limitation and that the invention is not limited thereto but rather only as set forth in the appended claims.

We claim:

1. A light emitting device comprising a relatively high refractive index photonic-wire semiconductor waveguide core surrounded in all directions transverse to photon propagation direction by relatively low refractive index medium to spatially confine photons strongly in said directions transverse to their propagation direction in the waveguide core, said waveguide core being an annular waveguide core with an inner rim, said rim being rough for R less than 50 lamda/$n_{core}$ and said waveguide core comprising an optically active excitable medium having major and minor sides and guiding semiconductor medium proximate said major sides, said active excitable medium and said guiding medium being so dimensioned in said transverse directions relative to the path of light propagation through the waveguide core as to provide greatly increased spontaneous-emission coupling efficiency for photons emitted into an electromagnetic field mode.

2. Light-emitting device comprising at least one waveguide element providing for spatially channeling a substantial $fraction_c$ characterized by Beta(space), of photons emitted from an excited medium into an electromagnetic field mode of interest using a photonic-wire waveguide as said waveguide element, and one element for achieving a resonant optical cavity cooperating with said photonic-wire waveguide, the electromagnetic field mode of interest being a TE or TM guided mode of said photonic-wire waveguide, said photonic-wire waveguide comprising a relatively high refractive index waveguide core with refractive index $n_{core}$ which is surrounded in all directions transverse to photon propagation direction by a relatively low refractive index medium with refractive index $n_{low}$ to spatially confine photons strongly in all transverse directions perpendicular to their propagation direction wherein said waveguide core has a dimension ds in said transverse direction and dw in said another direction, said dimension ds having a normalized value $ds_n$ larger than 0.05 and smaller than 4.0 where $ds_n = ds/ds_{lambda}$ with $ds_{lambda} = \text{Lambda}/n^s_{eff}$, where lambda is the active-layer emission wavelength in free space (vacuum or in the absence of material medium) and $n^s_{eff}$ is the effective refractive index given by $n^s_{eff} = \text{Sqrt}(n_{core}^2 - n_{low}^2)$, and Sqrt denotes square root, said dimension dw having a normalized value $dw_n$ larger than 0.05 and smaller than 1.1 for single-mode guiding and for Beta(space) value, where $dw_n = dw/dw_{lambda}$ with $dw_{lambda} = \text{lambda}/n^w_{eff}$, where $n^w_{eff}$ is the effective refractive index given by $n^w_{eff} = \text{Sqrt}(n_{core}^2 - n_{high}^2)$.

3. The device of claim 2 wherein ds is in the width direction and dw is in the thickness direction.

4. The device of claim 2 wherein the ratio of $n_{core}/n_{low}$ is larger than about 1.3.

5. The device of claim 2 wherein resonant optical cavity and said photonic-well waveguide form a closed loop cavity, at least a substantial portion of said closed cavity comprising said photonic-well waveguide.

6. The device of claim 5 wherein a plane of said closed loop cavity is parallel to a width dimension.

7. The device of claim 2 wherein said photonic-wire waveguide comprises an optically active excitable medium that can give rise to the radiation or absorption of electromganetic field energy, said medium being selected from semiconductor quantum wells, quantum dots, quantum wires, rare earth ions, and bulk semiconductor materials.

8. The device of claim 2 wherein said photonic-wire waveguide comprises passive dielectric material.

9. The device of claim 5 in which the length of the closed loop cavity Lc is microcavity in dimension with a normalized length Lcn of less than 300.

10. The device of claim 3 in which said microcavity provides a Beta(Freq) of larger than 0.05 when the emission width from the active medium is generally frequency width equal to 1/20 of the optical emission frequency exhibited by semiconductor quantum wells.

11. The device of claim 3 wherein the normalized width of the photonic-wire waveguide $ds_n$ is larger than 0.5 and smaller than 1.1 and $dw_n$ is larger than about 0.1 and smaller than about 0.5.

12. The device of claim 11 wherein the waveguide achieves an estimated Beta(space) value of about 0.25 and larger.

13. The device of claim 3 wherein the normalized width of the photonic-wire waveguide $ds_n$ is larger than 0.05 and smaller than 4.0, the normalized thickness $dw_n$ is larger than about 0.05 and smaller than about 1.1, the ratio $n_{core}/n_{low}$ is larger than 2.0.

14. The device of claim 13 wherein the waveguide achieves an estimated Beta(space) value of about 0.002 to about 0.3.

15. The device of claim 2 in which the waveguide comprises semiconductor materials selected from $In_xGa_{1-x}As_yP_{1-y}$ or $In_xAl_{1-x-y}Ga_yAs$ as the $n_{core}$ and and a material with a refractive index of about 1.6 or lower comprises the $n_{low}$ material.

16. The device of claim 15 for operation at 1.1 micron to 1.6 micron wavelength range for which ds is about 0.6 micron or smaller and dw is about 0.3 micron and smaller, with ds being larger than about 0.2 micron and dw being larger than about 0.03 micron.

17. The device of claim 2 in which the waveguide comprises semiconductor materials selected from $In_xGa_{1-x}N$ or $Al_xGa_{1-x}N$ as the $n_{core}$ materials and a material with a refractive index of about 1.6 or lower comprises the $n_{low}$ material.

18. The device of claim 17 for operation at 0.2 micron to 0.7 micron wavelength range for which ds is about 0.3 micron or smaller and dw is about 0.3 and smaller, with ds being larger than about 0.0.04 micron and dw being larger than about 0.01 micron.

19. The device of claim 18 in which the waveguide comprises semiconductor materials selected from $In_xGa_{1-x}As$ or $In_xGa_{1-x}P$ as the $n_{core}$ and a material with a refractive index of about 1.6 or lower comprises the $n_{low}$ material.

20. The device of claim 2 for operation at 0.6 micron to 1.0 micron wavelength range for which ds is about 0.4 micron or smaller and dw is about 0.0.25 and smaller, with ds being larger than about 0.1 micron and dw being larger than about 0.02 micron.

21. The device of claim 2 wherein said photonic-well waveguide is formed as a closed loop with one or more arcuate shapes, one or more linear shapes, and combinations thereof.

22. The device of claim 21 wherein radius of curvature Ri of the arcuate segment is in the range of large curvatures defined by radius of curvature smaller than 50 lambda/$n_{core}$.

23. The device of claim 22 wherein the waveguide width ds is larger than the lowest-order mode of propagation and at least a portion of an inner rim of said closed loop is roughened to increase scattering loss on higher-order modes.

24. The device of claim 22 wherein the waveguide normalized width $ds_n$ is larger than 0.05 and smaller than 100, without affecting the waveguiding of the lowest-order mode significantly, due to the large curvature of the waveguide.

25. The device of claim 2 in which lasing is achieved with said excitable medium excited to achieve population inversion in the photonic-well waveguide.

26. The device of claim 5 in which electromagnetic energy in said closed loop cavity is coupled to the electromagnetic energy in an output-coupled waveguide encircling partially thereabouts with a small gap of low refractive index material therebetween.

27. The device of claim 26 wherein the gap is smaller than 10 and larger than 0.0.02 optical wavelength in the photonic-wire waveguide.

28. The device of claim 27 wherein the modes in the closed loop cavity and the output-coupled waveguide are spatially the lowest-order mode.

29. The device of claim 28 wherein the closed loop cavity and the output-coupled waveguide comprise the same waveguide structure in a thickness direction.

30. The device of claim 29 including means for exciting the active medium in the output-coupled waveguide to reduce loss therein or to provide optical gain therein.

31. The device of claim 30 wherein the active medium is present only along a partial length of the output-coupled waveguide.

32. The device of claim 31 wherein the active medium is not excited beyond population inversion and can be further excited by absorbing photons propagating in the output-coupled waveguide.

33. The device of claim 32 wherein said active medium functions as a detector or modulator.

34. The device of claim 2 wherein the active medium is not excited beyond population inversion and can be further excited by absorbing photons propagating in the output-coupled waveguide.

35. The device of claim 2 wherein said active medium functions as a detector or modulator.

36. The device of claim 2 including means for optically exciting the excitable medium by illumination with electromagnetic energy.

37. The device of claim 2 including means for electrically exciting the excitable medium by carrier injection into said medium using a semiconductor p-n junction.

38. A combination of the device of claim 2 and one or more integrated circuits.

39. The combination of claim 38 further including an optical fiber between said device and said integrated circuit.

40. The device of claim 26 wherein said cavity is coupled to one or more said output-coupled waveguides, each serving either as a light output port, or a light input port, or both a light outputport and input port.

41. The device of claim 40 wherein properties of light in the output port are dependent on the properties of light in the input port and the amount of population excitation.

42. The device of claim 40 wherein the properties of light in the output ports and the properties of light in the input ports are used to process or transform optically coded signals or information.

* * * * *